United States Patent [19]
Rinard

[11] Patent Number: 6,046,586
[45] Date of Patent: *Apr. 4, 2000

[54] CROSSED-LOOP RESONATOR STRUCTURE FOR SPECTROSCOPY

[75] Inventor: George A. Rinard, Denver, Colo.

[73] Assignee: Colorado Seminary, Denver, Colo.

[*] Notice: This patent is subject to a terminal disclaimer.

[21] Appl. No.: 09/059,545

[22] Filed: Apr. 13, 1998

Related U.S. Application Data

[63] Continuation-in-part of application No. 08/627,263, Apr. 4, 1996, Pat. No. 5,739,690.

[51] Int. Cl.[7] .................................................. G01V 3/00
[52] U.S. Cl. .......................... 324/300; 324/318; 600/422
[58] Field of Search .................................... 324/300, 318, 324/322, 321, 316; 600/422; 333/219; 356/350

[56] References Cited

U.S. PATENT DOCUMENTS

| | | |
|---|---|---|
| 3,529,235 | 9/1970 | Day . |
| 3,559,043 | 1/1971 | Hyde . |
| 3,609,520 | 9/1971 | Sneed . |
| 3,701,959 | 10/1972 | Hansen . |
| 3,732,488 | 5/1973 | Franconi . |
| 4,314,204 | 2/1982 | Biehl et al. . |
| 4,435,680 | 3/1984 | Froncisz et al. . |
| 4,446,429 | 5/1984 | Froncisz et al. . |
| 4,480,239 | 10/1984 | Hyde et al. . |
| 4,504,788 | 3/1985 | Froncisz et al. . |
| 4,686,494 | 8/1987 | Kaneko et al. . |
| 4,777,459 | 10/1988 | Hudspeth . |
| 4,791,392 | 12/1988 | Brunner et al. . |
| 5,204,628 | 4/1993 | Konishi et al. . |
| 5,293,120 | 3/1994 | Gentsch et al. . |
| 5,365,173 | 11/1994 | Zou et al. . |

OTHER PUBLICATIONS

C. Franconi (no date) "Some developments in ESR spectroscopy".
J. Hyde and W. Froncisz, "Loop Gap Resonators", Chapter 7 pp. 277–305 (no date).
A. Tsapin and J. Hyde, "Bimodal Loop–Gap Resonator", Journal of Magnetic Resonance 100, pp. 484–490 (1992).

Primary Examiner—Christine K. Oda
Assistant Examiner—Brij B Shrivastav
Attorney, Agent, or Firm—Dorr, Carson, Sloan, & Birney, P.C.

[57] ABSTRACT

A resonator structure including a first resonator having a first resonator loop formed by a hollow channel with conductive walls and a second resonator having a second resonator loop formed by a hollow channel with conductive walls. The first resonator loop and the second resonator loop intersect so that the first and second resonator loops are substantially shielded to prevent coupling of high frequency energy between the first and second resonator loops. The orthogonally of the resonator loops can be adjustably control in either of two orthogonal axes. A sample is placed in a space defined by the intersection of the first and second resonator loops. High frequency energy is applied to the first resonator. The angle at which the second resonator loop intersects the first resonator loop is selected to substantially decouple the first resonator from the second resonator. A detector circuit detects the high frequency energy in the second resonator loop and supplies the detected signal for subsequent analysis.

15 Claims, 18 Drawing Sheets

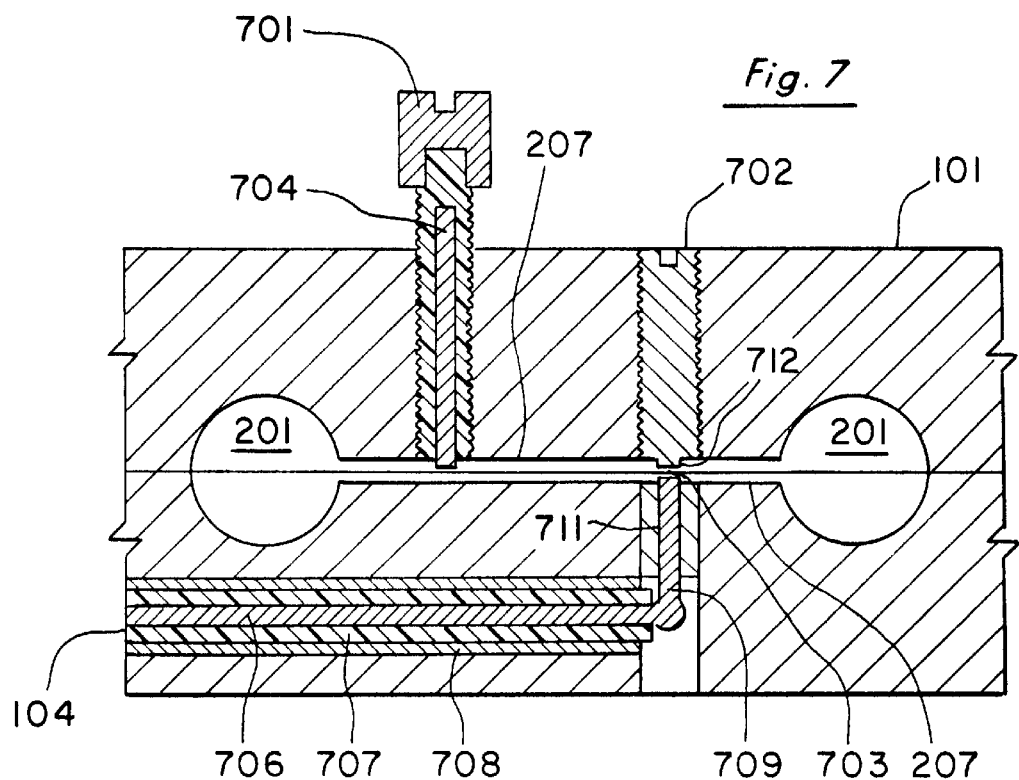
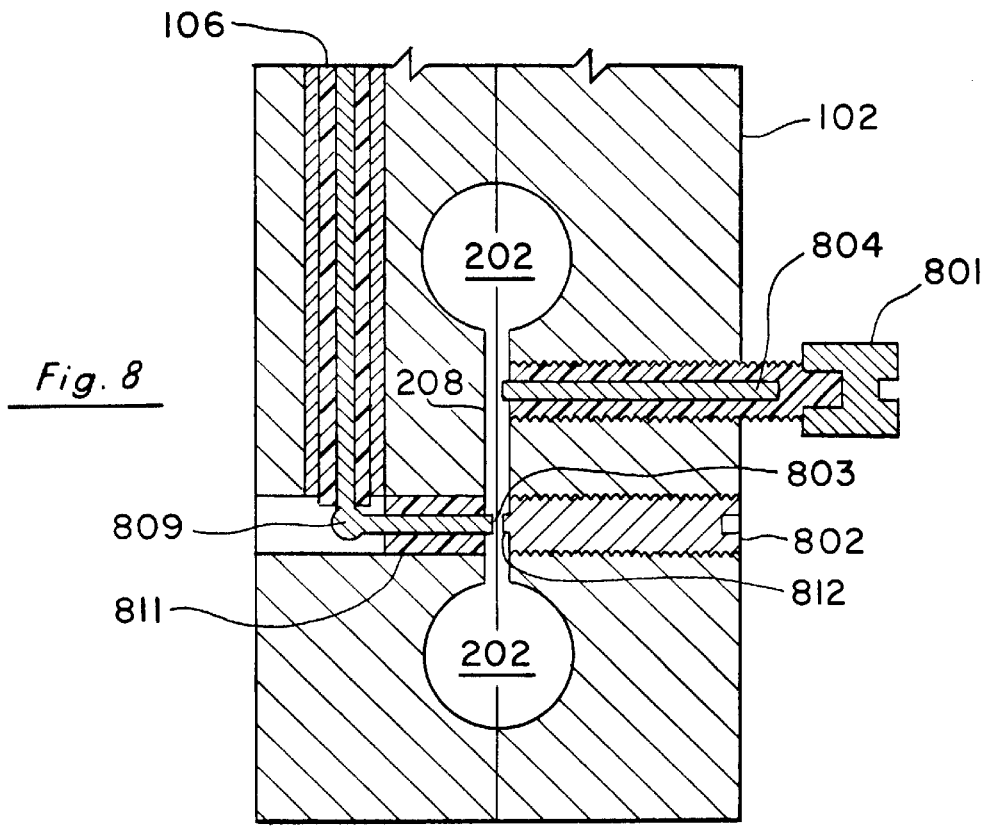

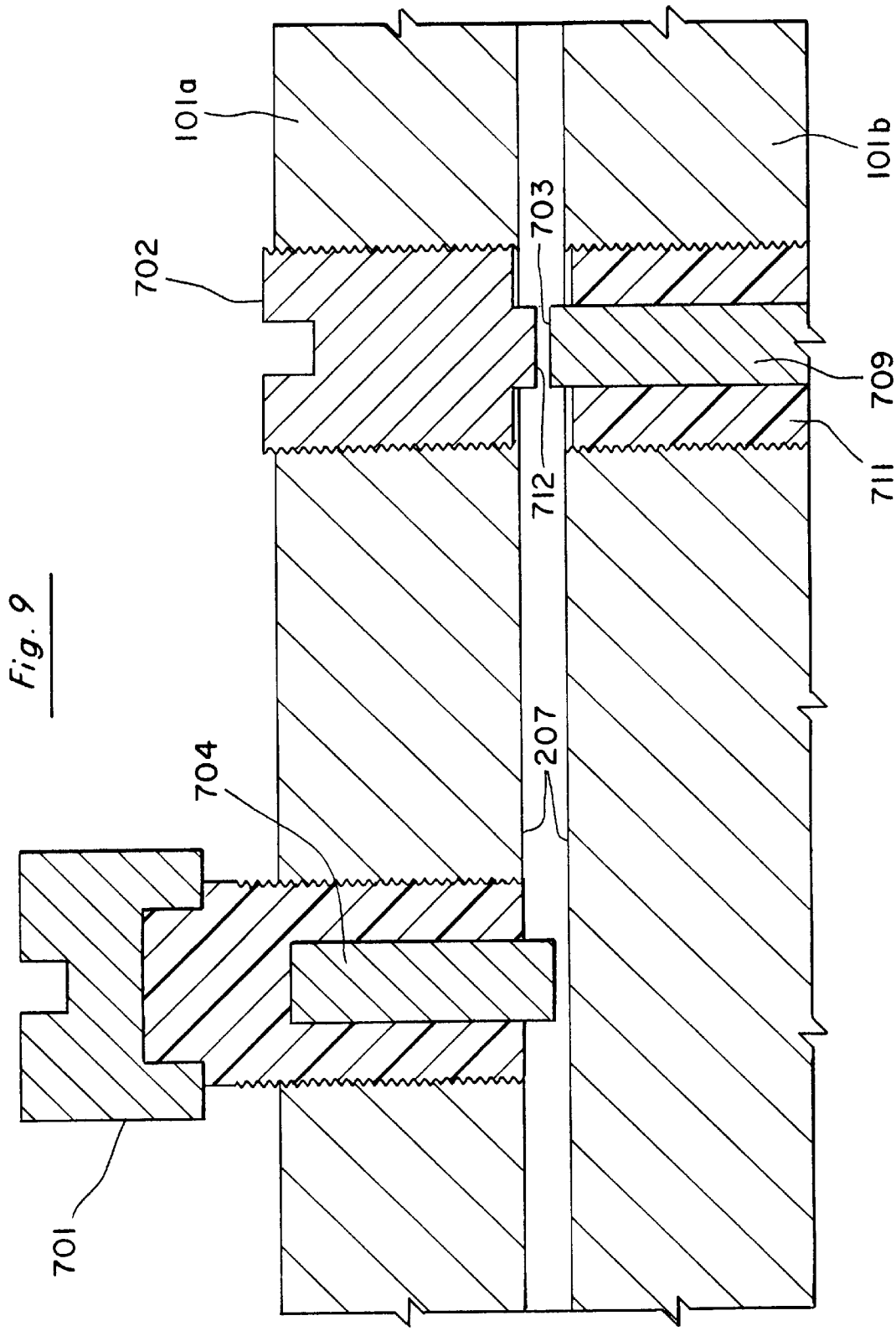

Fig. 11(a)
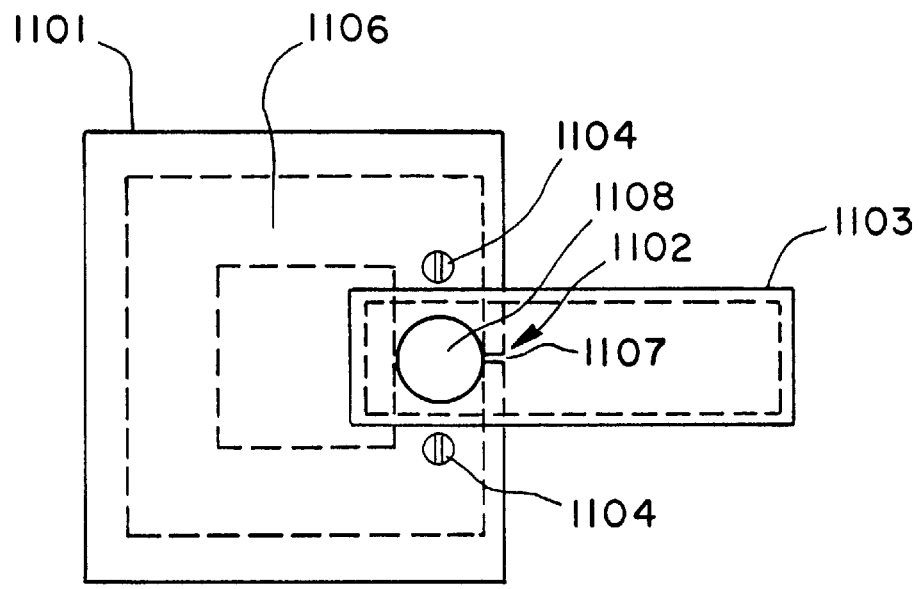
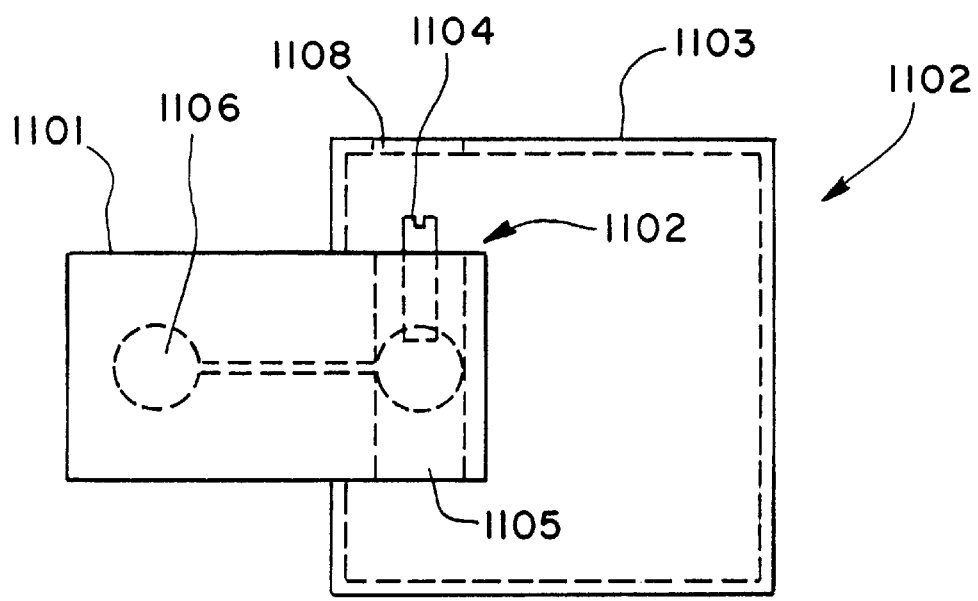
Fig. 11(b)

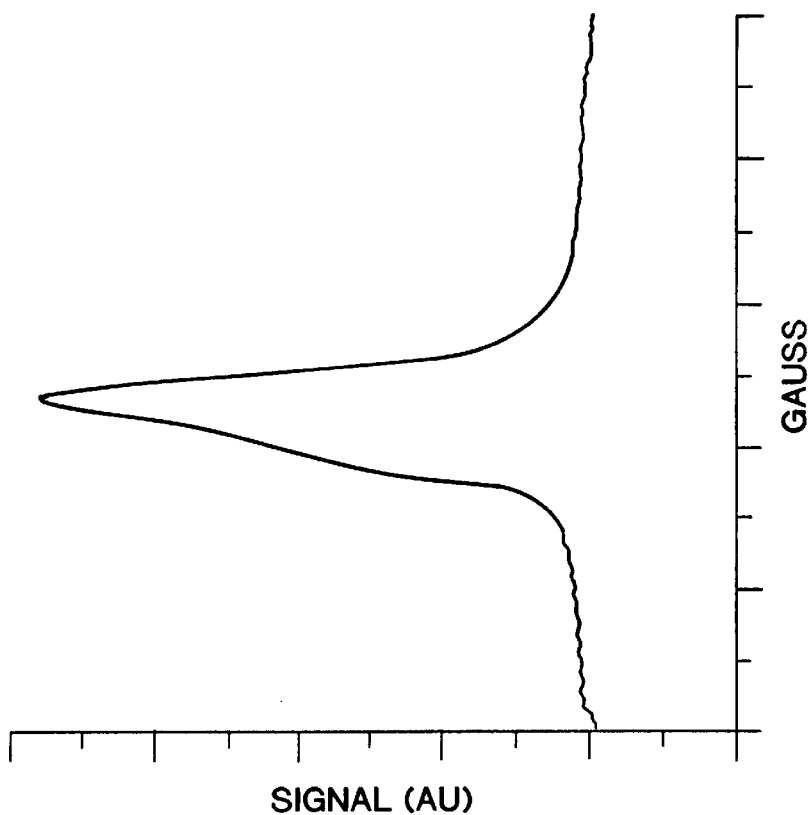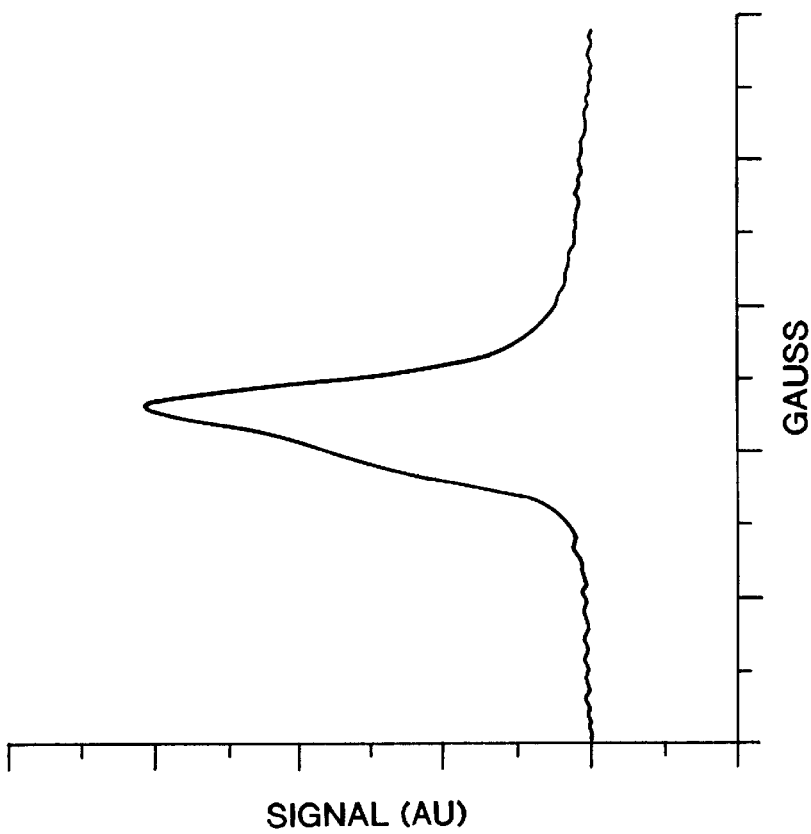

Fig. 18(a)
(PRIOR ART)
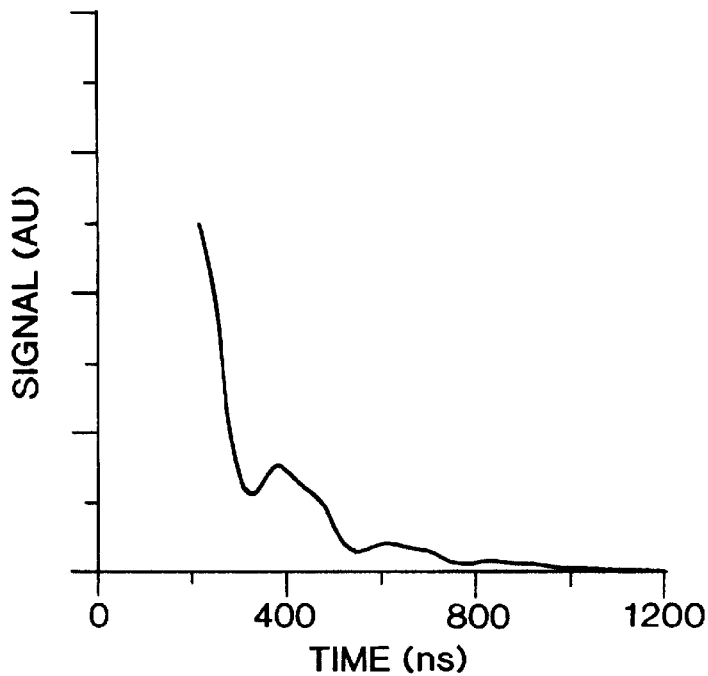
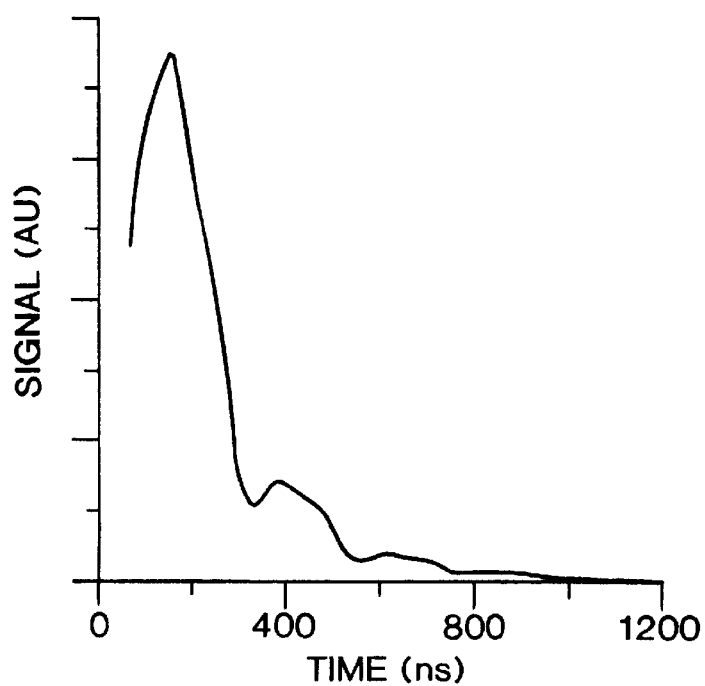
Fig. 18(b)

CROSSED-LOOP RESONATOR STRUCTURE FOR SPECTROSCOPY

RELATED APPLICATION

The present application is a continuation-in-part of the Applicant's U.S. patent application Ser. No. 08/627,263, entitled "Crossed-Loop Resonator Structure For Spectroscopy," filed on Apr. 4, 1996, now U.S. Pat. No. 5,739,690.

BACKGROUND OF THE INVENTION

1. Field of the Invention

The present invention relates, in general, to microwave and lower frequency resonators, and, more particularly, to resonators used in electron paramagnetic resonance (EPR) spectroscopy.

2. Statement of the Problem

Electron paramagnetic resonance (EPR) spectroscopy and electron spin resonance (ESR) spectroscopy are generally used to study molecular structure in chemistry, physics, biology, and medicine. EPR is also used to determine electron wave functions, lifetimes, and impurities in dielectrics used in solid state sciences. Prior EPP spectrometers comprise four main components: 1) a magnet to provide a steady DC magnetic field; 2) a high-Q microwave resonator in which a sample is placed; 3) a microwave bridge capable of producing an oscillating electromagnetic field which is coupled via a waveguide, coaxial cable, or the like to the resonator; and 4) a signal detector with field modulation, signal amplification and display systems.

In EPR, a steady magnetic field is applied to the chemical sample in the microwave resonator. The steady magnetic field causes the electrons in the sample to precess at a frequency defined by the sample composition. The precession frequency is called the paramagnetic resonant frequency and is proportional to the intensity of the applied steady magnetic field. The precession is altered by application of high frequency energy when the frequency of the energy is near the paramagnetic resonance frequency. If the sample contains unpaired electrons, the precession change can be detected. A comparison of change in electron precession as a function of magnetic field or frequency provides valuable information relating to the chemical characteristics of the sample.

A typical EPR spectrometer uses a reflection type measurement on the electrical resonator that contains the sample. In a reflection type spectrometer a single resonator is used. The sample is placed in the resonator and microwave energy is injected via a waveguide, coaxial cable, or the like into the resonator while the sample and resonator are positioned in the steady magnetic field. A microwave device called a circulator is usually used to separate the desired EPR signal from the microwave source power. A disadvantage of the reflection mode of operation is that any portion of the microwave source power that is reflected from the resonator will interfere with the EPR signal generated in the resonator. In one type of measurement, also called "continuous wave" because the input microwave energy is applied as a continuous AC signal, the resonator is tuned to provide minimal reflection of the input energy when the input frequency is different from the paramagnetic resonance frequency.

Analysis is accomplished by sweeping the magnetic field or the microwave frequency source until the precession frequency matches the frequency of the input microwave power. When the two frequencies are the same, microwave energy is absorbed by the sample resulting in reflected energy that can be detected by the detector electronics.

One disadvantage of reflection type spectrometers for continuous wave (CW) measurements is that the EPR signal is minute compared to the magnitude of the injected microwave energy. The signal detector must detect the EPR signal while separating out the injected microwave energy. It has proved difficult to completely separate the EPR signal from the input power.

Another difficulty arises in that any parasitic reflection of the microwave source caused by improper coupling of the input power to the resonator creates significant noise in the EPR signal. In addition, the source input waveguide and the detector waveguide must be critically coupled to the resonator to prevent a large reflection of the input power that would add to the EPR signal and saturate the detector electronics.

Phase noise or noise frequency modulation of the microwave source is converted to noise amplitude modulation in the reflected signal by the resonator, creating further noise in the EPR signal. Phase noise can not be eliminated from microwave sources. It can be reduced but this results in higher costs. Since the phase noise intensity is proportional to the source intensity, it becomes more serious at higher powers. Hence, current EPR tools must be operated at low power which in turn requires larger samples. A phase or dispersion component of the reflected EPR signal is difficult or impossible to study in reflection-type spectrometers because of this phase noise.

EPR tools can also be used for pulse-type measurements such as electron spin echo (ESE). In pulse type measurements, the input energy is provided by a high power pulse rather than a continuous wave microwave source. The pulse causes a near instantaneous change in the precession and a gradual decay as the sample returns to the baseline state created by the DC magnetic field. In this type of measurement the difficulty in separating input power from the EPR signal requires a delay after the application of the input pulse before a measurement can be made. Because the energy stored in the resonator by the input pulse must "ring-down" or dissipate before a measurement can be taken, much of the ESE signal can be lost in a reflection-type spectrometer.

Two types of resonators are used in EPR spectrometry. Cavity resonators were used in early spectrometers due to their easily modeled performance, availability, and high Q. Cavity resonators are called distributed element circuits because the microwave, magnetic, and electric field are continuously distributed and mix throughout the cavity. Characteristic dimensions of cavity resonators are of the same order of magnitude as the wavelength of the electromagnetic fields used. More recently, lumped element resonators have been suggested because their dimensions can be much smaller than the wavelengths of interest.

Lumped element resonators have much less mixing of the microwave, magnetic and electric fields; each are confined largely to separate physical areas of the resonator. The area where the magnetic field is concentrated can be identified primarily as an inductor. The area where the electric field is concentrated is identified primarily as a capacitor. A term used to describe some of these lumped element resonators is "loop-gap resonators". In this case, the loop is primarily inductive and the gap is primarily capacitive. In loop-gap resonators used for spectrometers, the sample is positioned in the loop so as to interact with the magnetic field.

Most loop-gap resonators are used in the reflection type spectrometers discussed above. Conventional loop-gap resonators have low Q compared to cavity resonators, however, because the magnetic field is concentrated in the vicinity of the sample, good EPR signals can be obtained.

One means that has been tried in order to reduce the problems associated with reflection type resonators is a bimodal resonator. A bimodal resonator structure would take advantage of the fact that the EPR signal is circularly polarized. In other words, the EPP signal is a rotating vector field and is equivalent to two signals that are 90 degrees out of phase in space and time. One of these EPR signals is coupled to the input source and can be detected in the conventional reflection type spectrometers discussed above. A bimodal resonator is a structure that detects the other EPR signal that is isolated from the input source. In theory, if two uncoupled modes with microwave magnetic fields oriented 90 degrees in space could be excited in the source resonator, one mode might be used to couple microwave energy into the sample and the other to detect the EPR signal. Hence, the bimodal resonator design promises to offer superior separation of input power from the EPR signal and make the EPR spectrometer immune to noise caused by reflected input power or phase noise.

The development of a practical bimodal resonator for EPR has been sought for over 20 years. A bimodal cavity resonator was commercially available from Varian Associates, Inc., but suffered from complex and difficult tuning requirements related to the cavity resonator design. Most recently, a bimodal loop-gap resonator was investigated for EPR spectroscopy. In 1992 A. I. Tapin, James S. Hyde, and W. Froncisz published a paper entitled *Bimodal Loop-Gap Resonator* in the Journal of Magnetic Resonance 100, 484–490 that proposed a loop-gap resonator in which the two orthogonal EPR modes did not overlap in some regions of space but overlapped and were orthogonal in the sample-containing region. Unfortunately, a commercially viable implementation has not been produced.

A need exists for a resonator structure for EPR spectroscopy that effectively isolates the input power from the detector yet is easy to tune and inexpensive to build.

Prior EPR spectrometers have used magnetic field modulation to enhance signal-to-noise ratio. Magnetic field modulation is introduced by a modulation coil creating an oscillating magnetic field that interacts with the steady magnetic field used to cause precession in the sample. The modulation coil is excited with a high frequency current, for example 100 kHz. The field modulation causes a modulation component in the EPR signal at the 100 kHz modulation frequency. The modulation component is amplified and fed to a phase sensitive detector where it is compared to a sample of the field modulation signal. The phase sensitive detector generates a first derivative of the paramagnetic resonance signal that can be detected.

Field modulation introduces noise and causes passage effects, making it an undesirable method of extracting the EPR signal. Field modulation is difficult to introduce into the resonator structure because it requires the placement of a magnetic coil in proximity with the resonator and sample. Also, to enable the modulation field to penetrate the resonator structure at reasonable power levels, the resonator must be thinned, making the resonator structure more fragile and electrically leaky.

Another source of noise in EPR spectrometers is thermal noise that is related to the temperature of the sample. To reduce thermal noise, it is desirable to cool the resonator structure including the sample to cryogenic temperatures. For low temperature measurements, it is desirable to place the resonator and field modulation apparatus in liquid nitrogen, liquid helium, or similarly filled cryostats. Presence of the field modulation coil makes placement in the low temperature cryostat more difficult. Also, it is difficult to tune conventional resonator structures while positioned in the cryostat. What is needed is a structurally rugged resonant structure that is compatible with low temperature operation and adaptable to automatic or motorized tuning in a cryostat or similar low temperature environment.

These limitations of prior art resonator structures are a primary impediment to the application of EPR spectroscopy to biology and biomedical research. Biological and biomedical applications of EPR spectroscopy are limited by low signal-to-noise resulting from the small number of spins in the sample and instrumental sources of noise, e.g., microwave source noise, magnetic field modulation, detector noise, and, in time-domain EPR, by the dead-time of the system after the microwave pulse. Because EPR is able to detect and analyze "free radicals" and metalloenzymes either naturally occurring or used as labels or probes, overcoming these impediments to EPR spectroscopy for biological samples has major commercial and scientific significance.

A closely related technology is called electron-electron double resonance (ELDOR) spectroscopy. ELDOR has long promised improved effective resolution and the ability to analyze new relaxation parameters as compared to conventional EPR. ELDOR is used in samples that have two or more electron paramagnetic resonance frequencies. In the past, ELDOR was carried out by applying a first microwave frequency to excite a first EPR signal at the first EPR frequency as is done in conventional EPR spectroscopy. A second microwave frequency was swept through the second paramagnetic resonance frequency while the first EPR signal was monitored. The variation of the first EPR signal as the second EPR frequency was excited is the ELDOR phenomenon.

The ELDOR phenomenon was difficult to create and observe in conventional resonant structures because narrow bandwidth of the resonator allowed little separation between the first and second EPR modes. Also, all of the above limitations of prior art EPR spectrometers relating to source noise, tuning difficulty, and the like are complicated severely by excitation of the sample at two frequencies rather than one. What is needed is a resonant structure allowing broadband excitation of EPR signals and an ability to detect EPR signals at frequencies that are distant from the excitation frequencies.

3. Solution to the Problem

The above problems of the prior art are solved by an EPR spectrometer having a resonant structure that effectively isolates the input source power from the detector electronics. By substantially eliminating source phase noise as a problem in the EPR spectroscopy, operation at much higher powers and the use of less expensive sources is enabled. A high degree of isolation between two loops of the crossed-loop resonator structure of the present invention and the elimination of reflected power from the input reaching the detector allows superheterodyne detection with a very stable baseline. This eliminates the need for field modulation and the signal distortion associated with field modulation. The elimination of field modulation, phase noise, and passage effects allows true dispersion spectra (as opposed to the first derivative of the spectra) to be obtained at power levels much higher than the saturation power level of the absorption signal. A high degree of isolation in the crossed-loop resonant structure reduces the effect of resonator ring-down and significantly decreases the dead-time of the instrument in pulse type measurements.

SUMMARY OF THE INVENTION

Briefly stated, the present invention involves a resonator structure including a first lumped element type resonator having a first inductive loop formed by a hollow channel with conductive walls and a second lumped element type resonator having a second inductive loop formed by a hollow channel with conductive walls. The first inductive loop and the second inductive loop intersect so that the first and second inductive loops are substantially isolated to prevent coupling of high frequency energy between the first and second inductive loops. The orthogonally of the inductive loops can be adjustably control in either of two orthogonal axes.

In another aspect of the present invention, the resonator structure is used for EPR spectroscopy by placing a sample in a space defined by the intersection of the first and second resonator inductive loops. High frequency energy is applied to the first resonator and the first resonator is adapted to produce a uniform magnetic field that is substantially confined to the first resonator inductive loop. The angle at which the second resonator inductive loop intersects the first resonator inductive loop is selected to substantially prevent the magnetic field produced in the first inductive loop from coupling into the second inductive loop. The second resonator inductive loop being substantially orthogonal to the first resonator inductive loop is coupled to the magnetic field generated by unpaired electron spins in the sample that is excited by the magnetic field of the first resonator inductive loop. A detector circuit detects the high frequency EPP signal coupled into the second resonator inductive loop and supplies the detected signal for subsequent analysis. Essentially only the energy produced by electron spins is coupled into the second resonator loop, the noise caused by source instabilities being reflected back to the source is isolated from the detector.

BRIEF DESCRIPTION OF THE DRAWING

FIG. 7 is a cross-sectional view illustrating a resonant frequency tuning mechanism and a power coupling tuning mechanism in accordance with the present invention;

FIG. 8 illustrates a cross-sectional view illustrating a second resonant frequency tuning mechanism and a second power coupling tuning mechanism in accordance with the present invention;

FIG. 9 shows the mechanism of FIG. 7 in greater detail;

FIG. 11(a) and FIG. 11(b) show a third embodiment in accordance with the present invention;

FIG. 17(a) and FIG. 17(b) illustrate absorption spectra observed using superheterodyne detection in accordance with the present invention;

FIG. 18(a) is an electron spin echo (ESE) measurement taken with a prior art reflection-type resonant structure; and FIG. 18(b) show an ESE measurement using the crossed-loop resonant structure in accordance with the present invention.

DETAILED DESCRIPTION OF THE DRAWING

1. Overview

The present invention involves a resonator structure particularly adapted for electron paramagnetic resonance (EPR) studies, although other applications for the resonator structure will be apparent. The present invention uses lumped element type resonator technology to provide an easily fabricated, versatile, and rugged resonant structure having isolation between an input resonator and an output resonator. Although prior attempts have been made to construct bimodal loop-gap resonators in which a single electrical structure supports two modes of resonance, the present invention uses electrically separate lumped element resonators that provide superior isolation between the two EPR signal modes.

Unlike other bimodal resonator structures, the "crossed-loop resonator" of the present invention is not an electrically single structure that supports two modes of resonance. The term "crossed-loop resonator" as used herein defines a new class of resonator structures in which two or more electrically separate resonators, although intimately connected mechanically, are arranged so as to provide electrical isolation between magnetic fields in each of the resonators.

Several distinct and unique elements combine to provide the crossed-loop resonator structure of the present invention. Specifically, each of the resonant structures are of a unique construction that enables easy, reliable tuning and a high degree of shielding to minimize high frequency radiation from the resonators. Also, the preferred construction of the resonant structure in accordance with the present invention enables the resonators to intersect in a manner that allows fine tuning of the coupling between the resonators and at the same time minimizes high frequency radiation from the resonators.

Although the resonant structure of the present invention is highly immune to noise created by inadequate matching of the source of input power to the resonant structure, the present invention includes a novel structure and method for coupling power that allows easy adjustment of the source to resonator coupling. Likewise, the present invention includes a simple yet flexible method for tuning the resonant frequency of each of the resonators.

Figure 16:
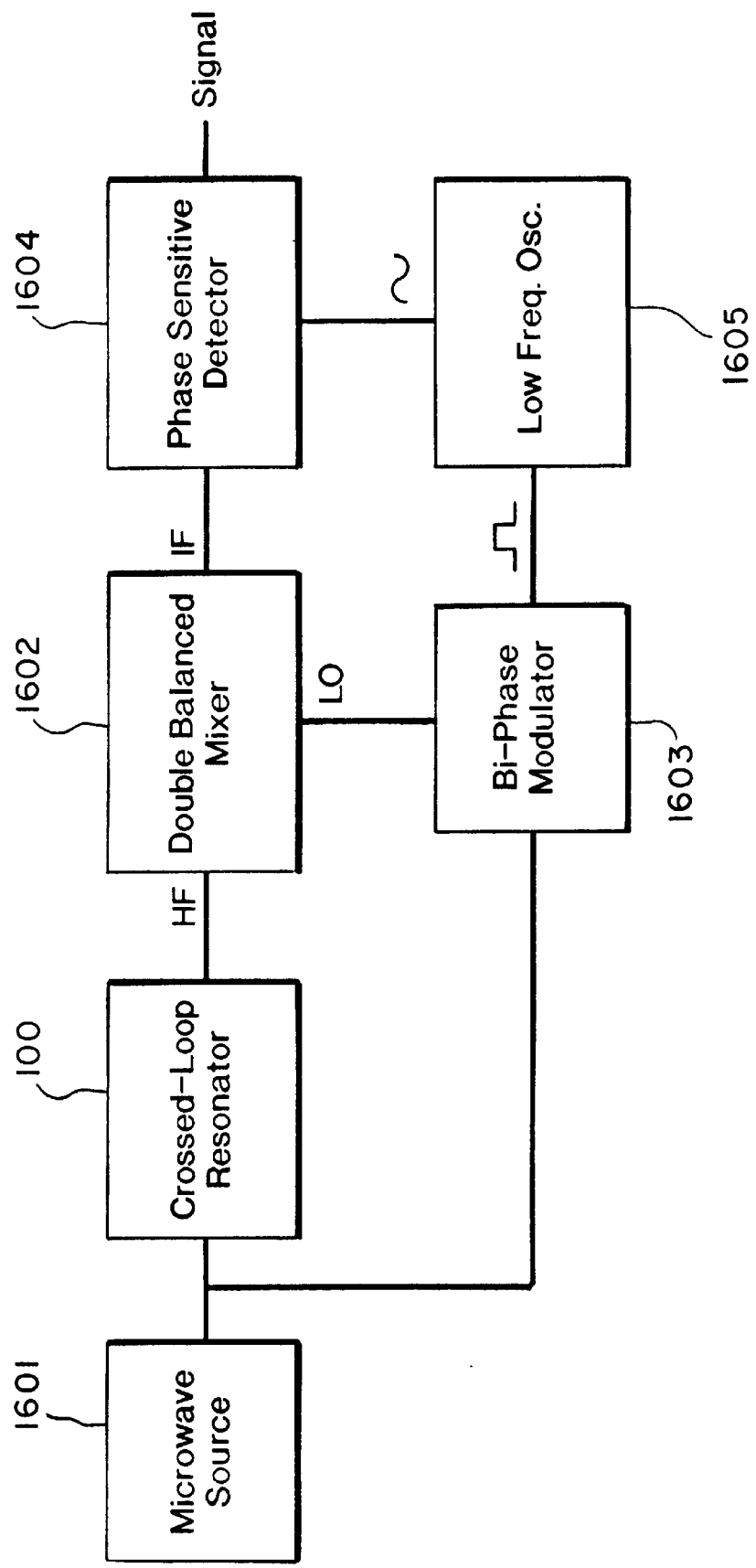
FIG. 16 shows in block diagram form a superheterodyne signal detection configuration in accordance with the present invention.

The superior performance of the resonant structure of the present invention in EPR spectrometry enables the use of superheterodyne technology in signal detection. The superheterodyne detection apparatus and method disclosed herein in reference to FIG. 16 provides a viable new means for detection of EPR signals and eliminates potential causes of noise and distortions.

Numerous variations of the present invention will be apparent to those skilled in the art to allow improved precision and automation to the method and apparatus in accordance with the present invention. These variations are equivalents to the specific structures discussed herein and are accordingly considered within the scope of the inventive concept specifically described.

Figure 1:
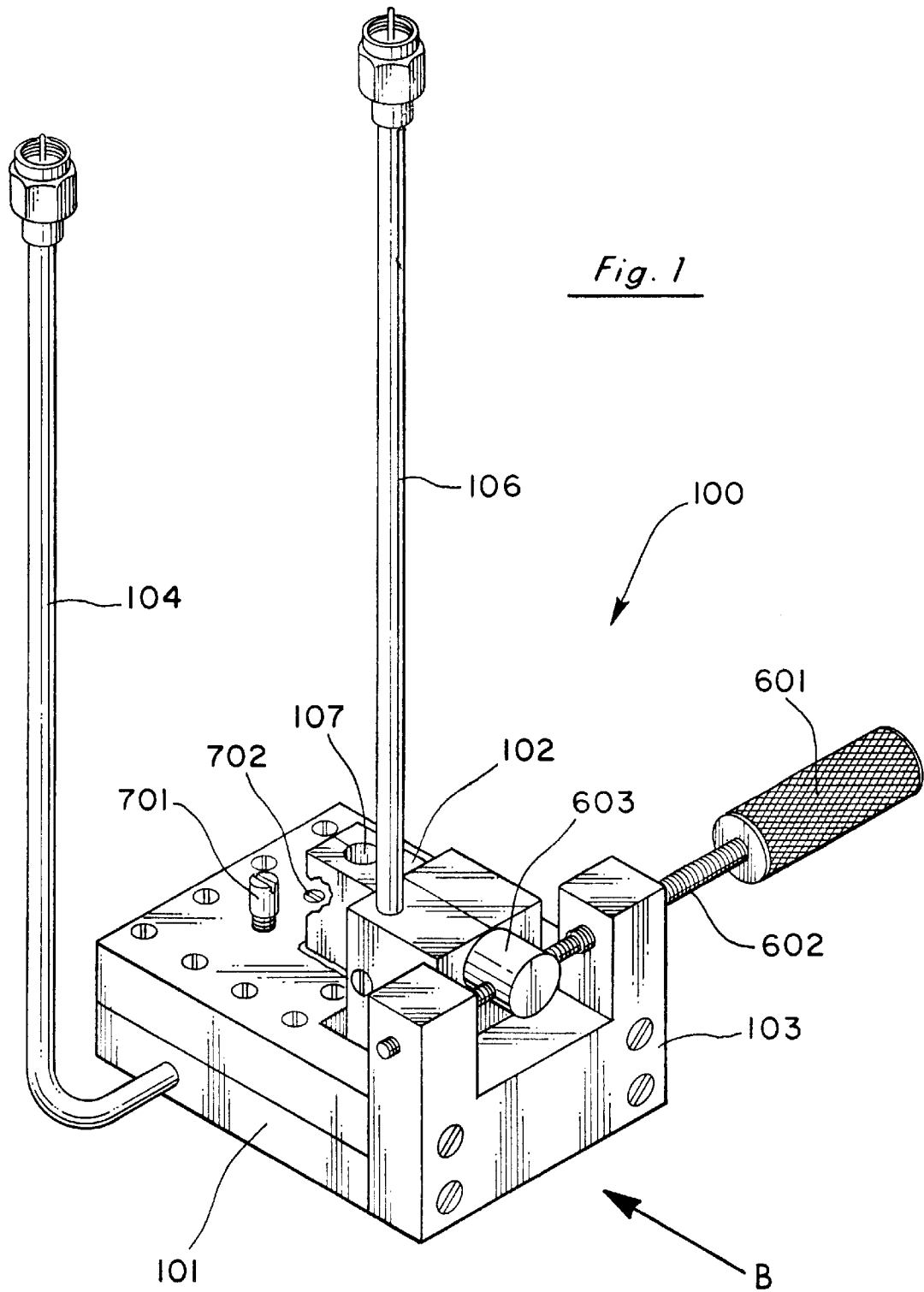
FIG. 1 is a perspective view of a resonator structure in accordance with a first embodiment of the present invention.

The present invention involves a "crossed-loop" resonator structure such as the first embodiment resonant structure 100 shown in FIG. 1. Generally, the present invention is an extension of lumped element or loop-gap type resonator technology using two loop-gap resonators that orthogonally intersect. Since the two resonators are essentially independent electrically except at the common area where they intersect, the orthogonal positioning results in a high degree of isolation between the magnetic and electric fields in the two resonators.

The resonant structure 100 in accordance with the present invention is specifically adapted for use in an EPR spectrometer. Specifically, resonant structure 100 is sized so that it can be positioned in a DC magnetic field having an orientation indicated by the line labeled B in FIG. 1 which is orthogonal to both of the loops at the point of intersection. It should be understood that for specific application other orientations are possible. One of the advantages of the present invention is the compact, flexible design that is easily adapted to various applications regardless of the orientation of the DC magnetic field with respect to the resonator structure. Resonant structure 100 shown in FIG. 1 preferably is comprised of solid materials giving it a rigid structure for easy handling.

Resonant structure 100 in accordance with the present invention includes three major components: primary resonator 101, secondary resonator 102, and field orthogonality tuning mechanism 103. Primary resonator 101 includes a high frequency energy input such as semi-rigid co-axial (coax) line 104 as well as resonant frequency tuning means 701 and input energy coupling tuning means 702. Similarly, secondary resonator 102 includes a high frequency conductor such as coax 106 for detecting energy in secondary resonator 102 as well as resonant frequency tuning means 801 and coupling tuning means 802 (shown in FIG. 8).

Figure 2:
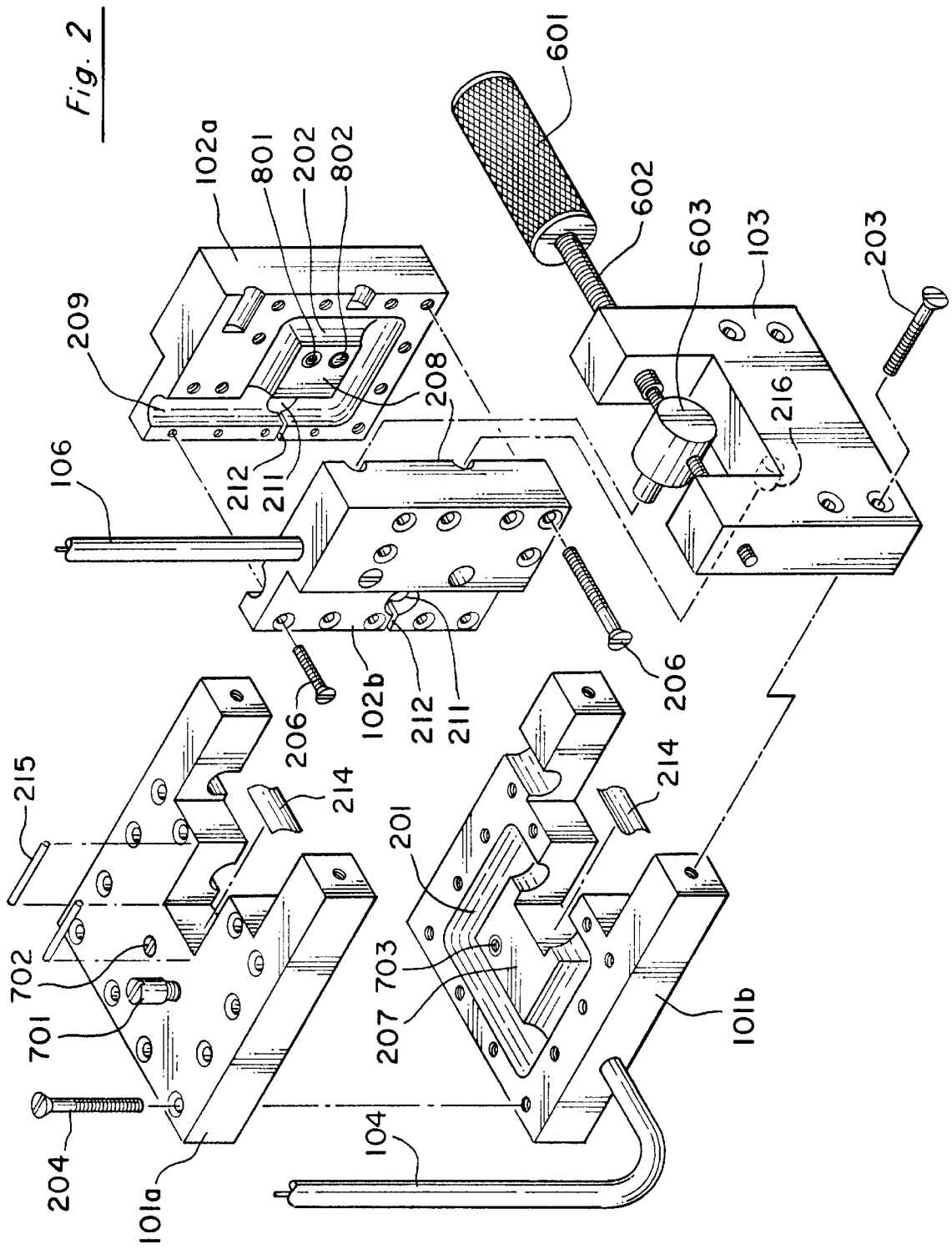
FIG. 2 is an exploded view of the resonator structure shown in FIG. 1.

In operation, a sample is placed via sample hole 107 into an intersection of primary resonator 101 and secondary resonator 102. The entire resonant structure 100 is placed in a DC magnetic field as is done in conventional EPR spectroscopy. High frequency energy is input through coax 104 causing a magnetic field to pass through the area where the sample is placed (i.e., where the primary and secondary resonators 101 and 102 intersect). The direction of the magnetic field lines is parallel to the axis of the first loop and essentially orthogonal to the axis of the second loop and to the axis of the sample tube therein. Near the electron paramagnetic resonance frequency the interaction of the sample with the high frequency input energy generates a circularly polarized magnetic field composed of two linearly polarized vector components spaced 90 degrees in space and 90 degrees in phase. One component of this circularly polarized field is parallel to the axis of loop 201 and the other component is parallel to the axis of loop 202 (201 and 202 are shown in FIG. 2). The linearly polarized component parallel to the axis of loop 202 produces a high frequency response signal in secondary resonator 102. The magnetic field in resonator 101 produced by the input power source is linearly polarized with only one component parallel to the axis of the inductive loop of resonator 101. Hence, substantially no source energy is coupled directly from the input resonator 101 into secondary resonator 102, and the high frequency response signal energy coupled to the secondary resonator 102 is almost purely due to electron paramagnetic resonance in the sample. The response signal is conducted via coax 106 to the detector electronics (not shown).

In order to ensure a high degree of isolation, it is necessary that the secondary resonator 102 is in fact unable to couple to the high frequency source energy circulating in resonator 101. This is accomplished by mechanically positioning resonator 102 so that the magnetic field flowing in resonator 102 is orthogonal to the magnetic field flowing in resonator 101. In the embodiment shown in FIG. 1, this is accomplished by field orthogonality tuning structure 103.

Although resonator 101 and resonator 102 are electrically coupled and mechanically connected together, there is at least one degree of rotational freedom allowing the resonator 102 to be rotated about an axis (described in FIG. 6) enabling a precision aligning of secondary resonator 102 with respect to primary resonator 101. Knob 601 is used to turn lead screw 602 to move nut 603 back and forth along the axis of lead screw 602. Nut 603 is rigidly attached to secondary resonator 102. An alignment pin 216 (shown in FIG. 2) defines the axis about which secondary resonator 102 will rotate. In this manner, secondary resonator 102 can be moved a few degrees in an easy, reliable manner.

2. Crossed-loop Resonator Construction

FIG. 2 illustrates an exploded perspective view of resonant structure 100 allowing easy description of the internal construction and assembly of the preferred embodiment resonant structure 100. Resonator 101 comprises an upper portion 101*a* and a lower portion 101*b* that are bolted or screwed together in the preferred embodiment by bolts 204. Similarly, resonator 102 is constructed in the preferred embodiment by a first portion 102*a* and a second portion 102*b* that are bolted or screwed together by bolts 206. The two piece construction of resonators 101 and 102 is a matter of convenience and ease of manufacture, and other manufacturing techniques including single piece construction could be substituted as equivalent.

Referring now to resonator portion 101b, a central portion is milled to form a gap plate 207 that appears as a planar hole in the central portion of resonator half 10ib. Gap plate 207 is formed by milling a small amount of material from the center of the block of material comprising resonator portion 101*b*. A similar machined plateau region (not shown) is formed on upper resonator half 101*a* to provide an upper plate for a resonator gap in resonator 101. Lower gap plate 207 and upper gap plate (not shown) form a capacitive gap when portions 101*a* and 101*b* are joined. The capacitance of the gap is defined by the surface area of the gap plates and the separation.

In a particular test structure, gap plate 207 was 12.5 millimeters wide and 16 millimeters long and had a spacing between the gap plates 207 of 0.51 millimeter. The exact choice of these parameters is the design choice used to set the range of resonant frequencies to which resonator 101 can be tuned. The gap spacing should be large enough to prevent high electric fields in the gap which could limit high power applications due to arcing or corona discharge. There is considerable latitude, however, in the design dimensions depending on the application and desired resonant frequency. The specific embodiment shown was constructed to operate in S-band and has a nominal resonant frequency of three gigahertz (GHz).

Surrounding gap plates 207 is an annular loop formed by milling out a semi-circular cross-section in each of halves 101a and 101b. In the particular example, loop 201 is approximately 5 millimeters in diameter and has a circular cross-section. The diameter of loop 201 should not exceed about 0.15 lambda (λ) where λ is the free space wavelength at the frequency of operation. Loop 201 can be made smaller at the expense of a lower Q. It is believed that best Q and good field uniformity in the loop can be achieved when the loop diameter is about 0.1λ. It is not necessary that the entire loop 201 have the same diameter although excellent results have been achieved with a substantially constant diameter around loop 201.

Loop 201 and loop 202 are illustrated as rectangularly shaped, however, any convenient shape can be used. A circular shape may provide a higher filling factor, while other geometries may provide construction or tuning benefits that are desirable for a particular application. Accordingly, the specific rectangular shape illustrated in the preferred embodiments is not a limitation of the teachings of the present invention.

The nominal resonant frequency of resonator 101 is determined by the inductance of loop 201 and the capacitance of the gap created by gap plates 207. By positioning loop 201 completely surrounding gap plates 207 the loop gap resonator can be entirely enclosed and shielded by the outer conductive material surrounding loop 201. This ability to completely shield primary resonator 101 is a key advantage in accordance with the present invention.

High frequency input power supplied by coax 104 is coupled to primary resonator 101 via coax termination 703. Coax termination 703 aligns with coupling screw 702 in upper resonator portion 101a. The details of the interaction of coupling tuning screw 702 and coax termination 703 are described in greater detail in reference to FIG. 7. Also, resonant frequency tuning screw 701 is positioned over lower gap plate 207 and extends through upper gap plate 207 (not shown). The construction and operation of resonant frequency tuning screw 701 will also be described in greater detail in reference to FIG. 7.

In the test structure, secondary resonator 102 is constructed from two halves 102a and 102b in a similar manner to that described for primary resonator 101. Secondary loop 202 is formed having similar dimensions (i.e., a 5 millimeter semi-circular annular ring in each half) as loop 201. Although it is not necessary that loop 202 and loop 201 have similar dimensions, it is convenient for manufacture and aids in matching resonant frequencies of each resonator.

Gap plate 208 is formed in each of halves 102a and 102b to form a gap for secondary resonator 102. In the particular example tested, gap plates 208 were about 10 millimeters square and provided a gap spacing of 0.25 millimeters. The particular dimensions given for the specific example provided essentially the same resonant frequency for primary resonator 101 and secondary resonator 102. The resonant frequency of secondary resonator 102 is tuned in a similar manner using tuning screw 801 that enters into the gap of resonator 102 through a hole in gap plate 208 of resonator portion 102a. Coupling of coax 106 is accomplished in a similar manner to coupling of coax 104 using a tuning screw 802 that enters through gap plate 208 in alignment with coax termination 803 shown in FIG. 8.

Although resonator 101 and secondary resonator 102 are substantially similar in design, several important differences exist that allow resonators 101 and 102 to be interlocked so that loop 201 intersects loop 202 to define a sample volume. A portion of resonator 101 is cut out as shown in FIG. 2 resulting in an interruption of annular loop 201 and a portion of gap plate 207. Likewise a hole 211 is bored through resonator portions 102a and 102b so as to perpendicularly intersect loop 202. A gap 212 is cut into the side of resonator portions 102a and 102b extending from the edge of bore 211 away from gap plates 208. When resonator 102 is placed into the cutout portion of resonator 101, cutout portion 212 aligns with gap plates 207 and bore 211 aligns with loop 201. In this manner, loop 201 is actually completed and enclosed by bore 211.

In the preferred embodiment the mechanical coupling between resonator 101 and resonator 102 allows one degree of rotational freedom allowing resonator 102 to be rotated with respect to resonator 101.

Good electrical contact must be maintained in the cutout area of primary resonator 101 between the two resonators to prevent leakage currents that would couple between the two resonators and reduce isolation. Leakage would also reduce the quality factor, Q, of at least one of the resonators. Good electrical contact can be provided, for example, by beryllium copper flat springs 214 between abutting surfaces of the two resonators. In addition, conductive packing material 215 is inserted in the space outside the two loops in the area where the two resonators almost contact. The open spacing with conductive packing will allow small but sufficient penetration of magnetic field modulation (discussed herein below) so that continuous wave measurements can be made in a conventional manner. However, as discussed below, other embodiments of the device allow more thorough penetration of field modulation.

Primary loop 201 is totally enclosed except for the rectangular cutout to allow secondary loop 202 to be inserted so that the two loops are aligned at substantially right angles. Secondary loop 202 is totally enclosed except for the sample hole 209 that allows insertion of a sample into the sample volume. Bore 211 and slot 212 allow the magnetic field in loop 201 to pass at right angles to the field in loop 202 and allows loop 201 to operate properly. The high degree of isolation is achieved by having at least one loop totally enclosed and separate from the other except at the point where they cross. The other loop is similarly almost totally enclosed but other configurations than the specific embodiment shown in FIG. 1 and FIG. 2 are practical and will be apparent to those of skill in the art.

The principle of operation is best understood by picturing the magnetic fields in the loops of each resonator 101 and 102. The field lines circulate within loops 201 and 202. Where the loops cross, there is little cross coupling if the field lines are orthogonal. Only one degree of freedom is required to maintain field orthogonality. This is accomplished in the preferred embodiment of FIG. 1 by the fact that resonator 101 and resonator 102 are constructed and mounted so that they can be rotated over an angle of a few degrees about the axis defined by alignment pin 216 shown in phantom in FIG. 2. Frame 103 has a rigid attachment to one of resonators 101 or 102, in this case resonator 101 via bolts 203. Lead screw 602 provides a means for adjusting the angle of resonator 102 with respect to resonator 101. Other means of maintaining field orthogonality are described herein below in the alternative embodiments.

Figure 3:
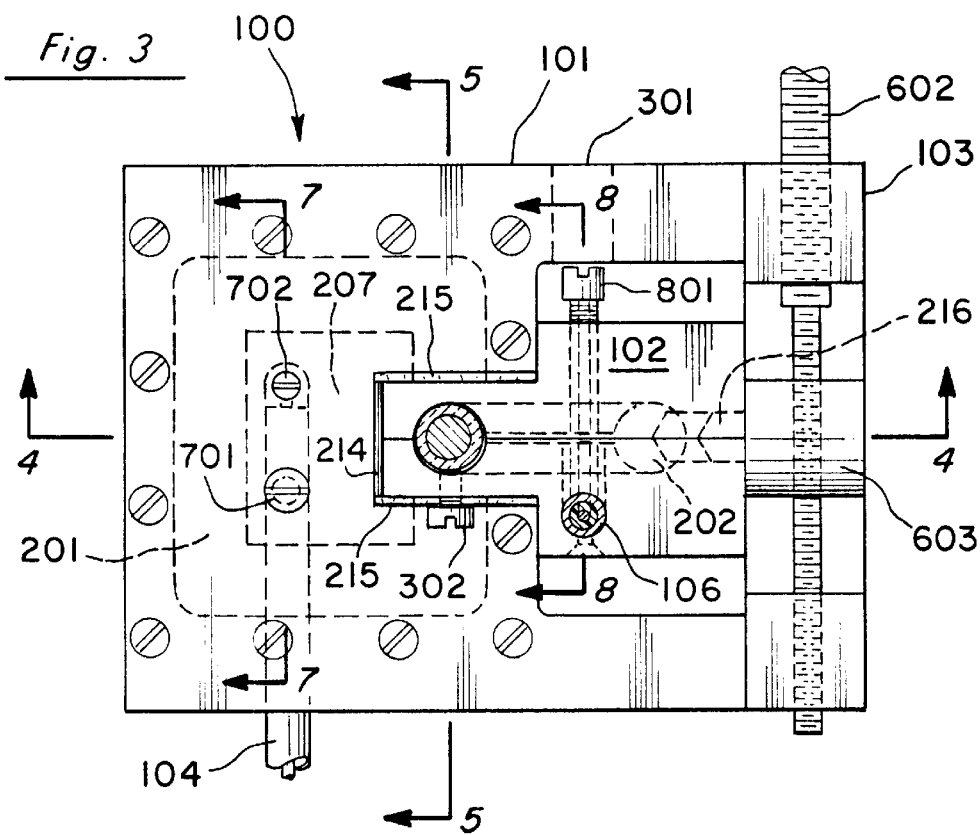
FIG. 3 is a top view of the resonator structure shown in FIG. 1.

FIG. 3–FIG. 6 illustrate preferred embodiment resonator structure 100 at various perspectives to improve understanding of the construction, interaction, and operation of the present invention. FIG. 3 is a planar view looking down towards the upper surface of resonator 101. It can be seen that resonator 101 including gap plates 207 and loop 201 are aligned substantially in a first plane that is perpendicular to a plane in which gap plates 208 and loop 202 are aligned. Field orthogonality tuning control 103 is attached to one end of the structure and will be described in greater detail in reference to FIG. 6.

Resonant frequency of primary resonator 101 is easily adjusted by turning screw 701 as described hereinbefore. Because screw 701 is accessible from the exposed upper surface of primary resonator 101, tuning is not difficult. Likewise, tuning of the coupling between coax 104 and resonator 101 is easily accomplished by turning screw 702 that is also exposed on the upper surface of resonator 101. In contrast, resonator tuning screw 801 and coupling screw 802 for resonator 102 must be accessed through an access port 301 drilled or cut into the side of a frame portion of resonator 101. The frame portion of resonator 101 to which tuning mechanism 103 is attached serves no electrical purpose in the resonator structure in accordance with the present invention, and is merely a mechanical support to hold the various components together. Hence, size and positioning of access hole 301 is largely a matter of design choice and other means for accessing tuning screw 801 and coupling screw 802 are acceptable equivalence to the specific structure disclosed.

Figure 4:
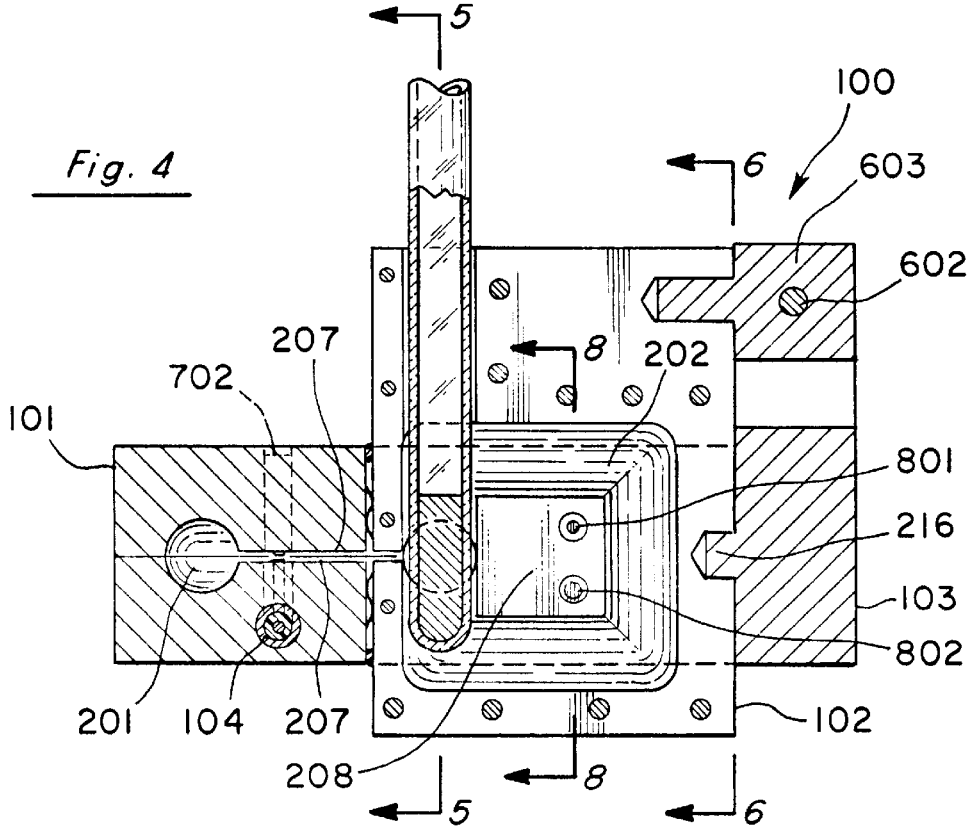
FIG. 4 is a cross-sectional view of the preferred resonator structure in accordance with the present invention.
Figure 5:
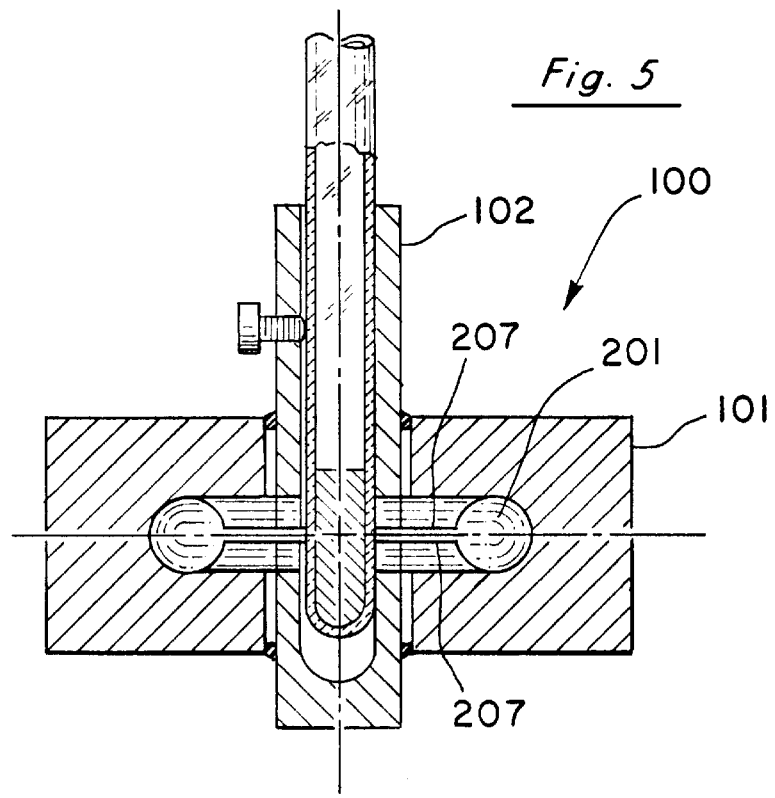
FIG. 5 shows a cross-sectional view taken orthogonally to the view of FIG. 4.

FIG. 3 and FIG. 4 illustrate many of the features already discussed in relation to FIG. 1 and FIG. 2. However, FIG. 3 and FIG. 4 are useful for a general understanding of the order, arrangement, and relative size and spacing of components discussed herein. In particular, it should be noted that alignment pin 216 is aligned with the center of both resonator loop 201 and resonator loop 202 and passes through the intersection of the two loops. This axis of rotation defined by alignment pin 216 determines the alignment of primary resonator 101 with respect to secondary resonator 102.

3. Field Orthogonality Tuning

Figure 6:
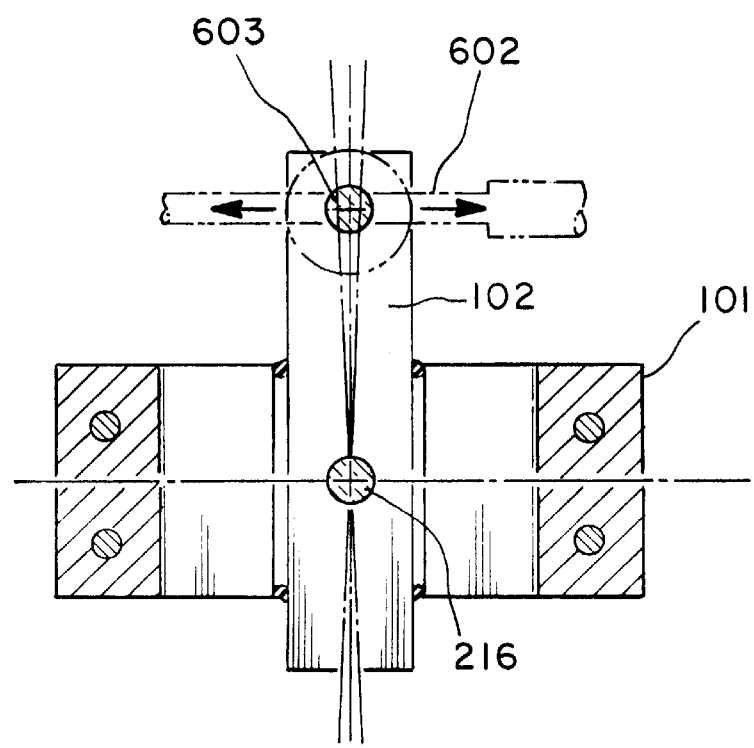
FIG. 6 is a cross-sectional view through a first embodiment tuning mechanism in accordance with the present invention.

FIG. 6 illustrates a side planar view of the field orthogonality tuning mechanism in accordance with a first embodiment of the present invention. In this first embodiment, field orthogonality is controlled by physically rotating LGP 102 with respect to LGR 101. The action of knob 601 (FIG. 2), lead screw 602, and follower nut 603 have been described hereinbefore. Simply put, they serve to move follower nut 603 back and forth in the directions suggested by the straight arrows in FIG. 6.

A pin extending from follower nut 603 extends into the side of resonator 102 as shown in FIG. 2. Alignment pin 216 is rigidly attached to frame 103 and passes into a fixed position of the frame of primary resonator 101. Turning lead screw 602 results in rotation of secondary loop 102 by a few degrees along the arc indicated by the dashed-line axes shown in FIG. 6.

Alignment pin 216 is positioned in alignment with the intersection of loop 201 and 202 as shown in FIG. 3. This rotation about a single axis allows the magnetic fields in loops 201 and 202 to be aligned highly orthogonally. This is important because even if high quality machining is used, insertion of the sample during operation may distort the magnetic fields traveling in loops 201 and 202 to a degree requiring some adjustment to achieve maximum isolation between primary resonator 101 and secondary resonator 102. Also, variations in machining, surface contours, and material composition will result in some disturbance of the magnetic fields traveling in loops 201 and 202, hence, some tuning is required. The structure shown in FIG. 6 offers simple and reliable tuning that has proven to be so stable that once a sample is inserted and the resonator structure 100 in accordance with the present invention is adjusted for high isolation between primary resonator 101 and secondary resonator 102, this isolation can be maintained even for long periods of data collection. This robustness is uncommon in prior bimodal cavity resonators that attempt to achieve the same functionality of the present invention.

4. LGR Resonant Frequency Tuning

FIG. 7 through FIG. 9 illustrate a preferred method of tuning resonant frequency of each of resonant structures 101 and 102. Since it is useful to be able to tune both resonator 101 and resonator 102 to the same frequency, it is necessary to have some means of tuning at least one of the resonant structures. FIG. 7 is a cross-sectional view of the gap and loop portion of primary resonator 101. The resonator capacitance is provided by the separation between gap plates 207 as described hereinbefore. Dielectric tuning screw 701 is made of a suitable material (for example Teflon or alumina) and contains a cylindrical metal slug 704. Tuning screw 701 is threaded into and through one side of primary resonator 101 in such a manner as to allow adjustment of the spacing of metal slug 704 from the opposite side of the gap. This creates two series capacitances: a capacitance from lower gap plate 207 to the metal slug 704 and from metal slug 704 to the upper gap plate 207. These two capacitances combine in parallel with the capacitance of the gap created by gap plates 207.

The adjustment of tuning screw 701 changes the spacing of the metal slug and thereby changes the parallel capacitance. This allows change of the resonant frequency of primary resonator 101 by a few percent with little or no change in the quality factor, Q, of the section. Frequency tuning could also be provided by a metal screw in place of the tuning screw 701 with a dielectric case and a metal slug 704. However, a pure metal screw would result in contact resistance between the screw and primary resonator 101 and lower the Q of primary resonator 101.

Tuning screw 801 in secondary resonator 102 operates in a similar manner. Metal slug 804 is moved closer to or farther away from gap plate 208 thereby changing capacitance of the loop gap resonator 102. In this manner, the resonant frequency of either or both of primary resonator 101 or secondary resonator 102 can be adjusted to be the same, or offset by some predetermined amount. The area and shape of metal slug 804 can be tailored to vary the degree of tuning ability. For example, by increasing the surface area of metal slug 804 that faces gap plate 208 the amount of change per unit of displacement will increase proportionately.

While the preferred embodiment allows both resonator 101 and resonator 102 to have a tunable resonant frequency, if only one resonator is adjustable the apparatus in accordance with the present invention may be used for EPR spectrometry. Also, other equivalent means are known for tuning LGR resonators that may be adequate in certain applications.

5. LGR Input and Output Coupling

FIG. 7, FIG. 8, and FIG. 9 illustrate a preferred method of coupling input power (FIG. 7) and the output signal (FIG. 8) with resonant structure 100 in accordance with the present invention. Although the high degree of isolation between primary resonator 101 and secondary resonator 102 together with a relatively low Q inherent in lumped element technology means that coupling efficiency is less significant, the structure in accordance with the present invention is easily adjustable to tune the input power effectively. This allows the use of lower power and less expensive microwave sources as well as a higher signal for a given amount of input power.

As shown in FIG. 7 input coax 104 enters primary resonator 101 and includes a central conductor 706 surrounded by an insulating sheath 707 and an outer shield conductor 708. Coax 104 terminates at a central conductor 709 that is electrically connected to the coax central conductor 706 at a right angle in the preferred embodiment. Conductor 709 is surrounded by an insulating sheath 711 comprising Teflon, or any other known insulating material. Conductor 709 terminates inside the gap formed by gap plates 207 with tuning screw 702 as shown in FIG. 7. Tuning screw 702 comprises a conductive material that preferably includes a shaped terminating end 712. The terminating end 712 is spaced a distance from coax termination 703 that is selected by turning screw 702. Tuning screw 702 thus provides a variable capacitance between the termination of the coax 703 and upper gap plate 207.

As shown in FIG. 8, tuning for the detector output coupling to output coax 106 is performed in a similar manner. Coax 106 is terminated in an extension 809 that is surrounded by insulating sheath 811. Conductor 809 extends into the gap at terminal extension 803 formed by gap plates 208. Conductor 809 is aligned with conductive tuning screw 802 formed in the opposite side of secondary resonator 102. By turning secondary resonator tuning screw 802 the distance between the shaped termination 812 of screw 802 and conductor 809 can be altered to vary the capacitive coupling between conductor 809 and right hand gap plate 208.

The preferred embodiment illustrated in FIG. 7, FIG. 8, and FIG. 9 uses capacitive coupling for both the input power and for detecting the output EPR signal. Capacitive coupling uses a capacitive reactance to couple power from the coax into or out of the gap of the loop gap resonators 101 and 102. A similar and sometimes more useful coupling can be achieved by inductively coupling to the inductive loops 201 or 202. In particular for input or primary resonator 101, it may be desirable to inductively couple power into loops 201 as higher power can be coupled using inductive coupling. Higher power translates into a larger signal hence better readings in many applications. Inductive coupling can be accomplished by terminating a coax cable such as cable 104 shown in FIG. 7 with a loop of wire inside loop 201. Current passing through the loop of wire will induce a magnetic field which is coupled by loop 201 to primary resonator 101. Inductive coupling is considered an equivalent substitute for the capacitive coupling specifically shown in the method of the present invention.

6. Alternative Embodiments

Figure 10A:
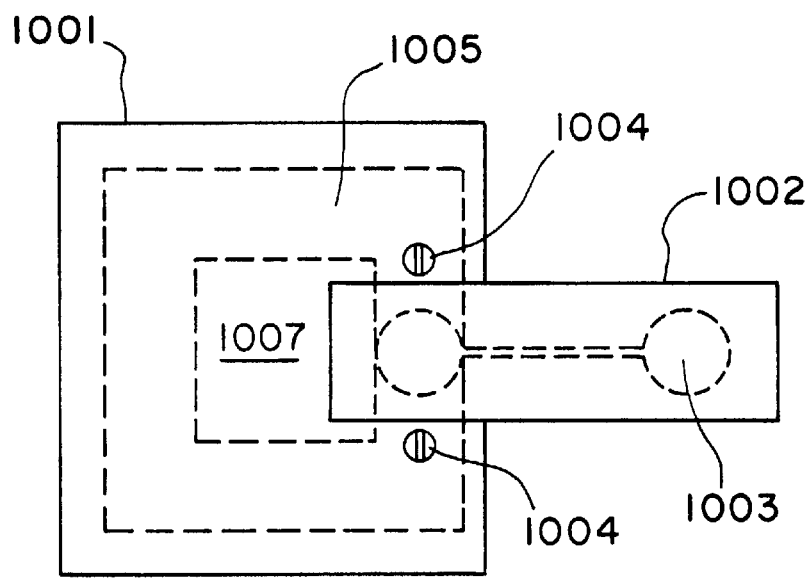
FIG. 10(a) and FIG. 10(b) illustrate a second embodiment in accordance with the present invention.
Figure 10B:
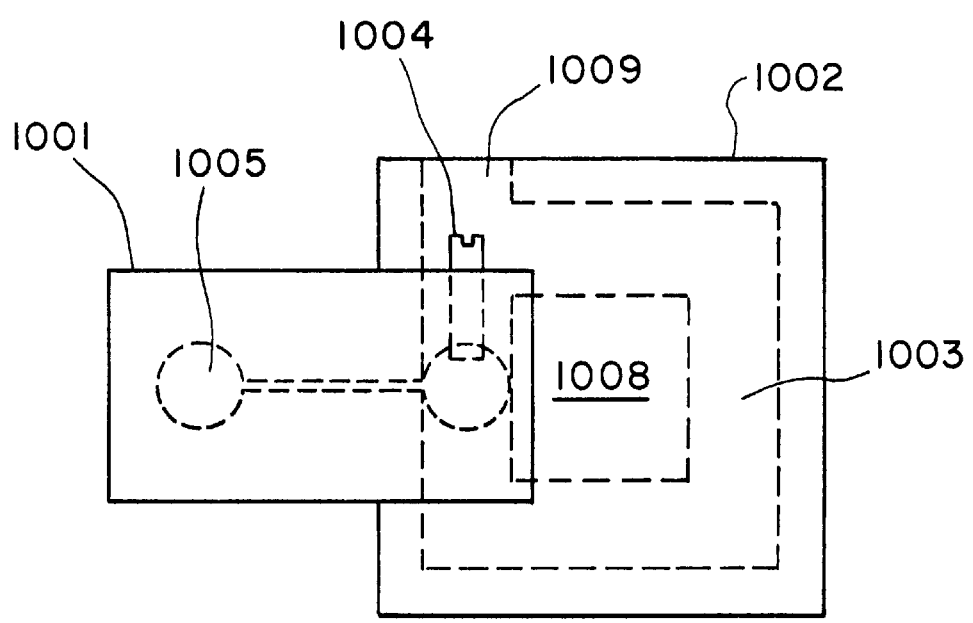

FIGS. 10(a), 10(b), 11(a), 11(b), and 12 illustrate various alternative embodiments incorporating the teachings of the present invention. FIG. 10(a) shows a simplified view looking down upon an alternative primary resonant structure 1001 coupled to an alternative secondary resonant structure 1002. The many details described hereinbefore in reference to the first embodiment such as the input energy feed and detector coaxial cable are omitted in the description of the alternative embodiments as they will be substantially the same for each of the alternative embodiments. FIG. 10(b) illustrates a view of the resonant structure shown in FIG. 10(a) looking down at the upper surface or a side surface of resonant structure 1002.

In the embodiment shown in FIG. 10(a) and 10(b) resonators 1001 and 1002 are rigidly fixed to each other so that the resonators cannot be rotated with respect to each other. Resonators 1001 and 1002 are either machined as separate pieces that are rigidly attached or machined from a single piece of metal or other material. Tuning of the isolation between resonant structure 1001 and resonant structure 1002 is accomplished using tuning screws 1004 located on either side of the intersection of loop 1003 with loop 1005. Screws 1004 comprise a conductive or dielectric material that, as shown in FIG. 10(b), extends a variable amount into loop 1005. The presence of tuning screws 1004 in loop 1005 shapes or bends the magnetic field traveling in loop 1005. Particularly when screws 1004 are placed on one or both sides of the intersection of loops 1003 and 1005 this distortion is used to make the field in loop 1005 orthogonal to the field in loop 1003. This embodiment of the present invention offers a simpler construction by avoiding the use of tuning means 103 shown in the previous embodiment.

FIGS. 11(a) and 11(b) illustrate a third embodiment in accordance with the present invention. In this embodiment secondary resonator 1102 is foreshortened to increase the filling factor and is shielded by RF shield 1103 to prevent radiation. In this case, resonator 1102 is machined into the side of primary resonator 1101 in a manner similar to cutout portion 212 and bore 211 shown in FIG. 2. In the embodiment shown in FIGS. 11(a) and 11(b), however, the reentrant portion of inductive loop 1105 of resonator 1102 is increased in size to include the entire inner volume of shield 1103. Since this portion of inductive loop in resonator 1102 no longer has a large effect on the resonant frequency of resonator 1102, an alternative view is that the reentrant portion of resonator 1102 has been omitted. However, shield 1103 is still required to contain the return flux to loop 1105 of resonator 1102.

The capacitance for resonator 1102 is provided by a slot 1107 while the inductance for resonator 1102 is provided by loop 1105. Coupling to resonator 1102 is accomplished by capacitive coupling from the center of an output coaxial cable to gap 1107 in a manner analogous to that shown in FIG. 8. Alternatively, inductive coupling can be made by means of a small loop or loops of wire (not shown) on the end of the output cable (not shown) near the opening of loop 1105 in resonator 1102. In this embodiment, RF shield 1103 could enclose up to the entire resonator 1101 if desired so long as provision is made for access to tuning screws 1104 and sample tube insertion hole 1108. Tuning screws 1104 operate in a manner similar to tuning screws 1004 shown in FIGS. 10(a) and 10(b).

All of the embodiments above have been described in terms of a solid piece of conductive material having loop and gap structures machined therein, it should be apparent that other equivalent construction methods are known and can be used in accordance with the present invention. For example, an insulating non-magnetic material can be used and machined to form the loop and gap structures and subsequently plated with a highly conductive material such as silver, gold, or the like to a suitable thickness to provide adequate low conductivity surfaces. Likewise, a dielectric material can be formed in the shape of the gap and loop structures described herein followed by a plating on the exterior surface to a suitable thickness. In this case, the dielectric itself would fill the gap and loop structures rather than air as indicated in the preferred embodiments, and a portion of the dielectric would be removed to allow insertion of the sample. These construction methods would allow better penetration of field modulation due to their metal plating. Moreover, either resonator may contain the sample tube and either may contain provisions for adjusting isolation (i.e., field orthogonality) between the loops. So long as the primary feature set out herein in accordance with the present invention are used, all of these equivalent structures may be used.

Figure 12:
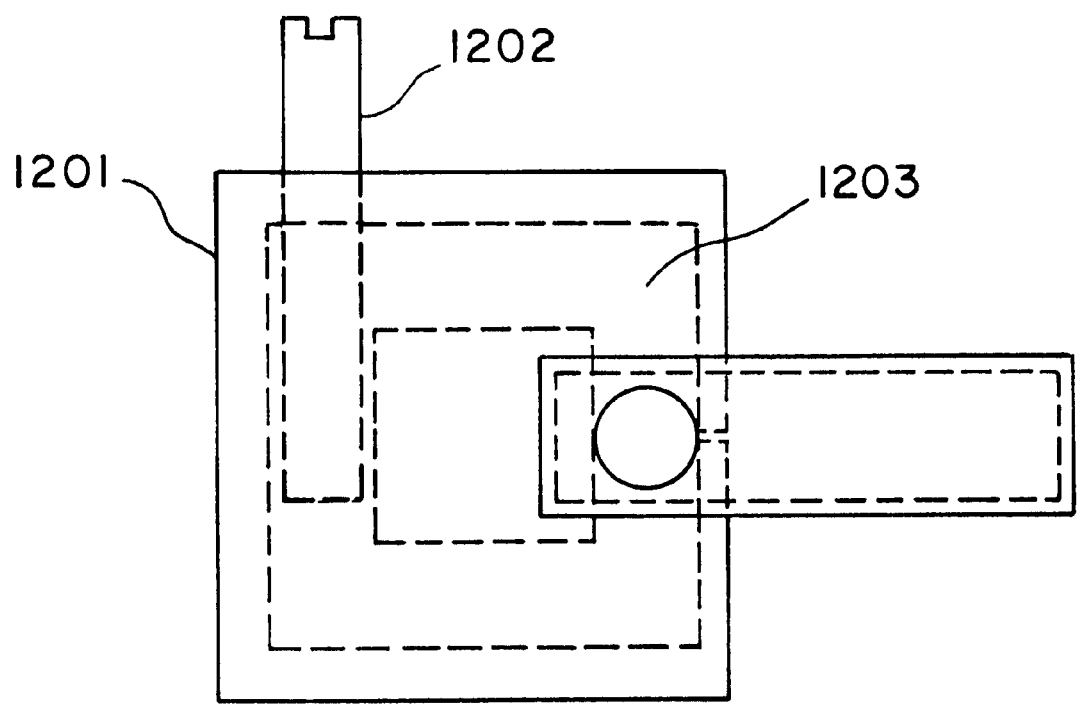
FIG. 12 illustrates an alternative embodiment structure for setting the resonant frequency in accordance with the present invention.
Figure 13A:
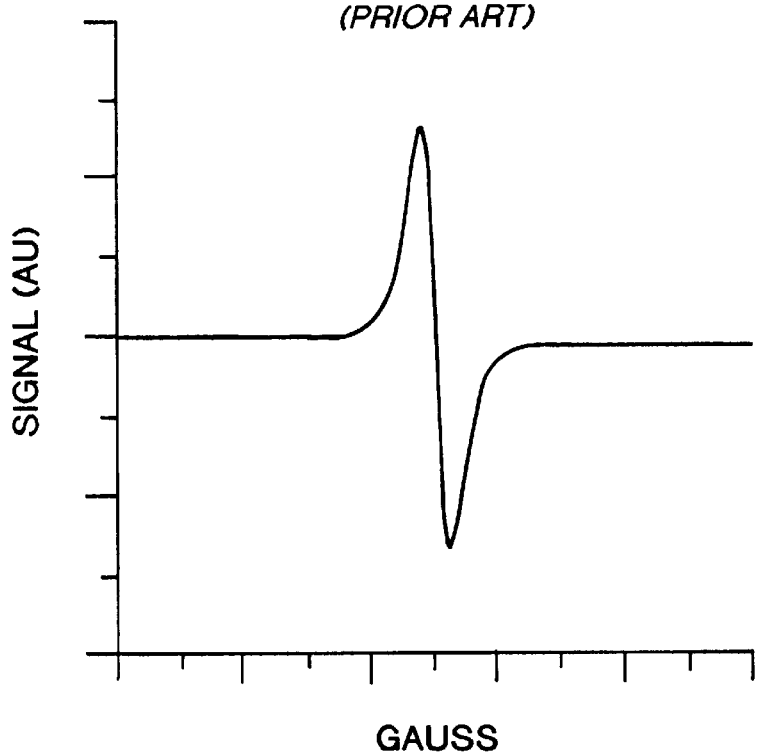
FIG. 13(a)–FIG. 13(d) illustrate comparative results of a prior art reflective spectrometers.
Figure 13B:
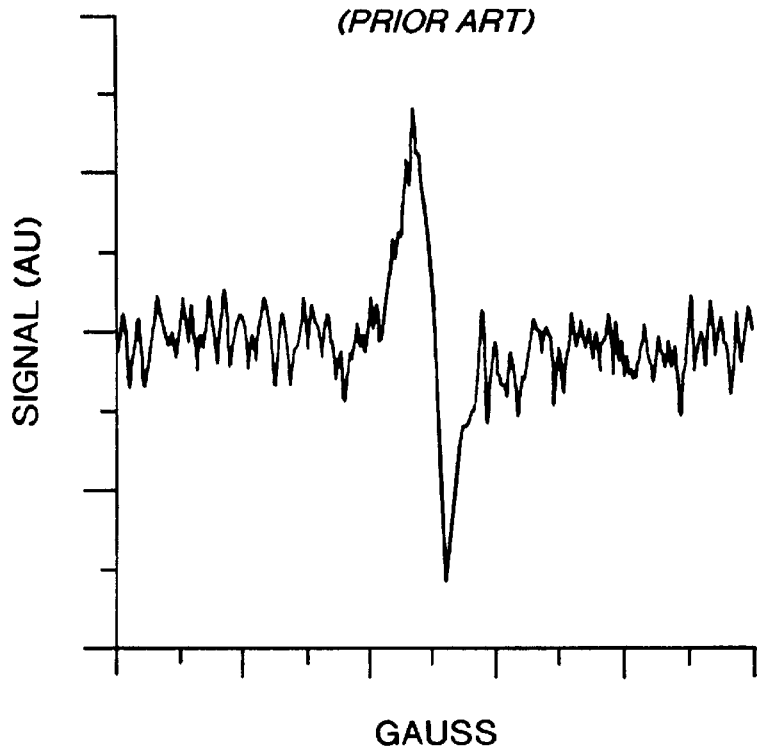
Figure 13C:
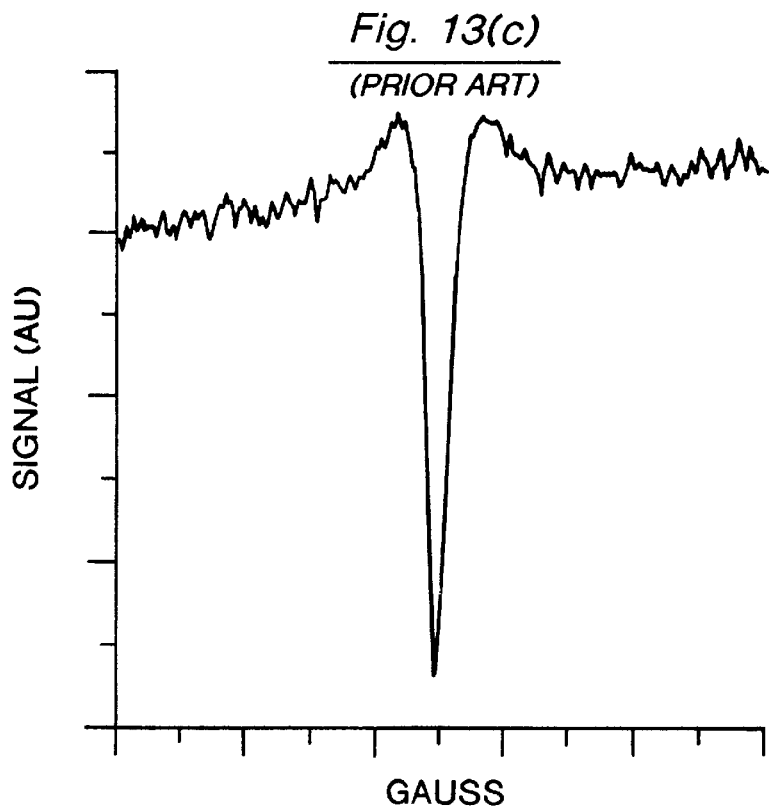
Figure 13D:
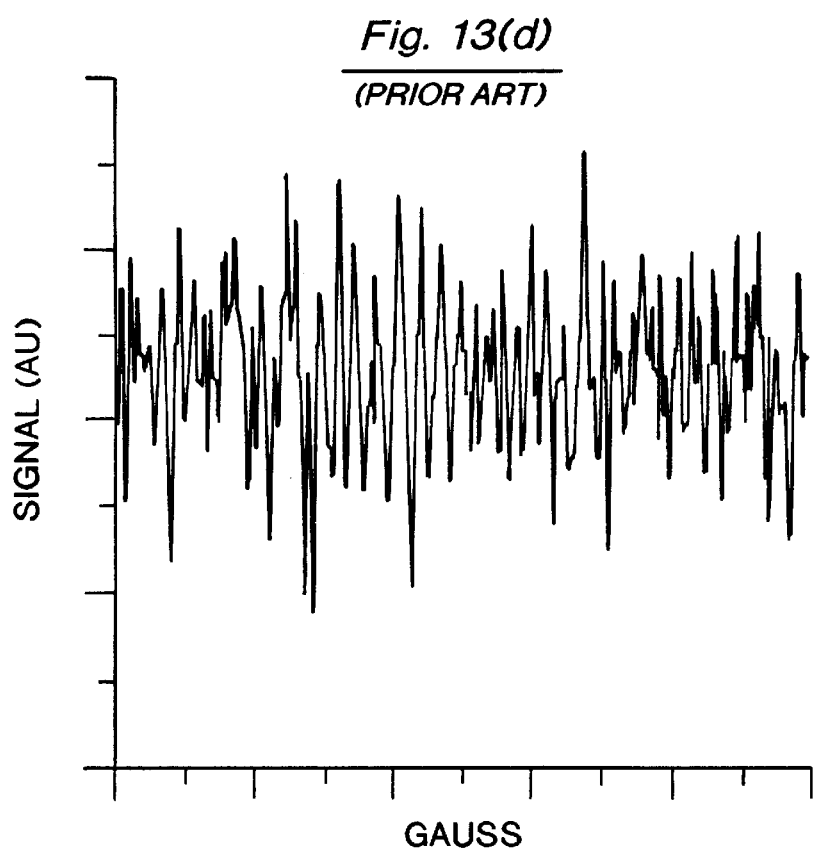
Figure 14A:
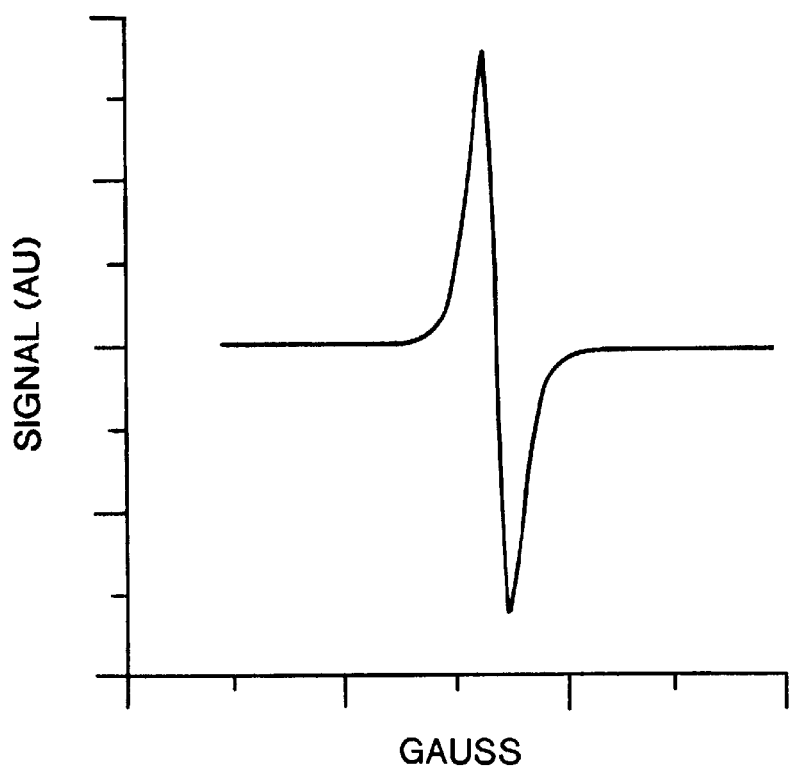
FIG. 14(a)–FIG. 14(d) illustrate comparative results of the present invention.
Figure 14B:
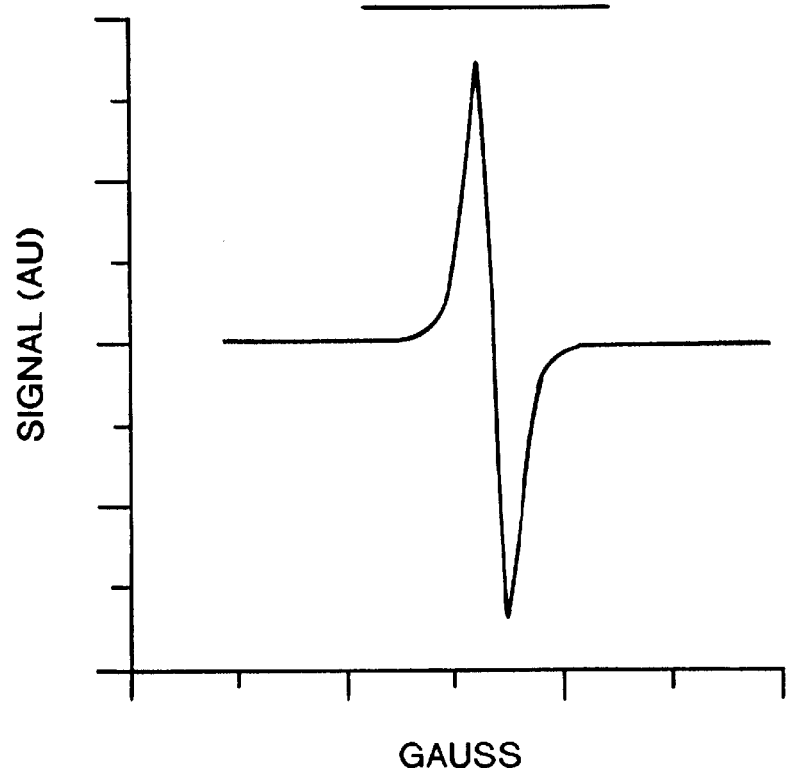
Figure 14C:
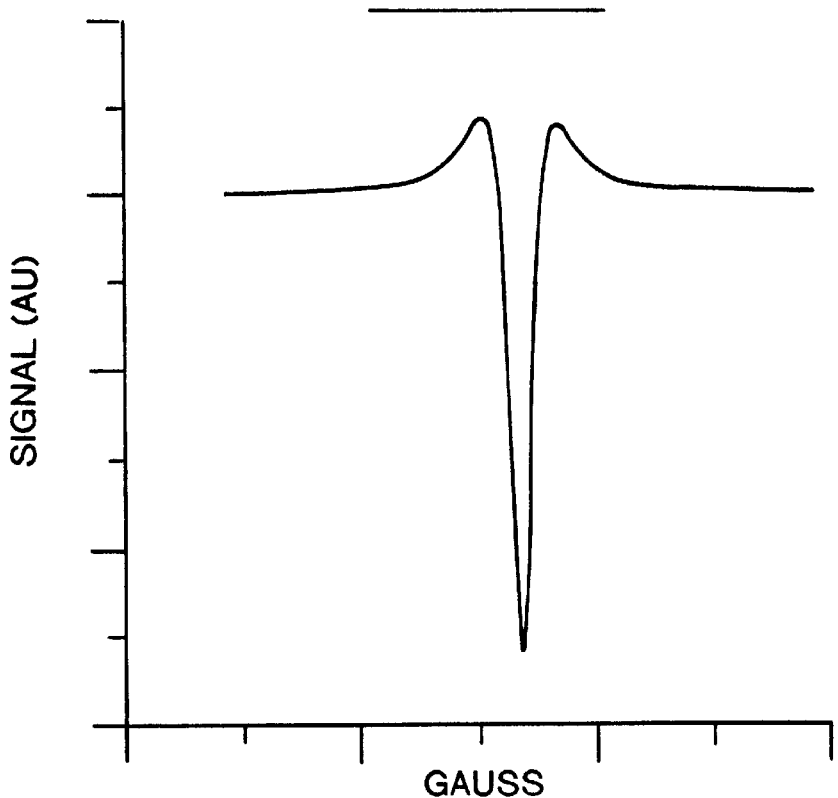
Figure 14D:
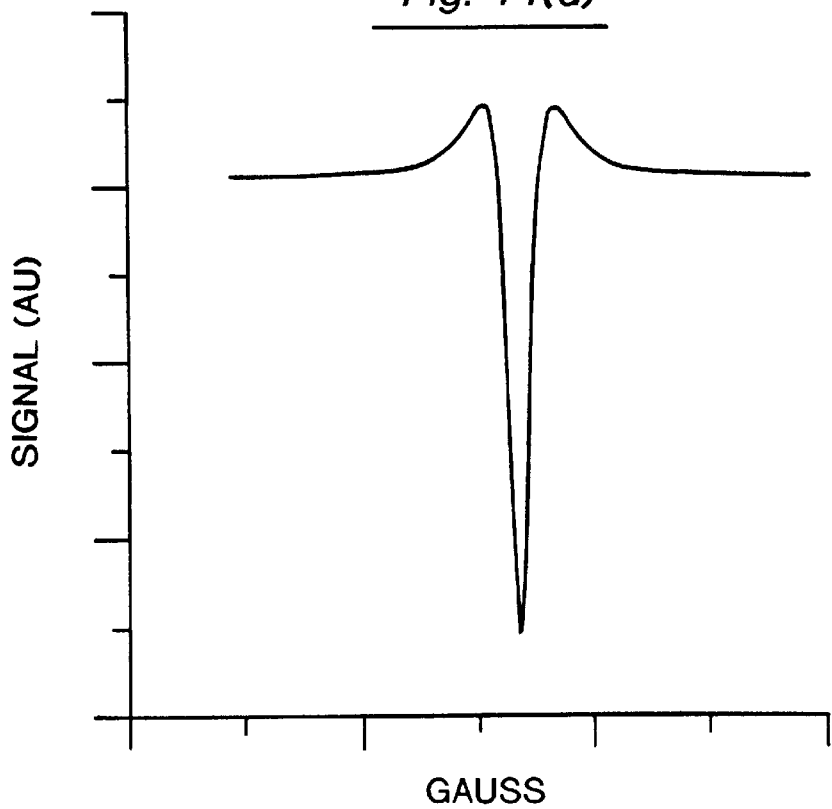

FIG. 12 illustrates a fourth embodiment in accordance with the present invention showing a novel method of tuning the resonant frequency of primary resonator 1201. In most applications it is desirable to have an ability to vary the resonant frequency of at least one of the resonators in particular the primary resonator that drives power through the sample. As shown in FIG. 12, a dielectric slug comprising a fluorinated polymer such as Teflon or alumina ($Al_2O_3$) or other suitable materials can be moved a variable amount through a screw structure into loop 1203 of primary resonator 1201. Dielectric slug 1202 will vary the field in a manner to change the resonant frequency by a wide range estimated to be 5%–10% plus or minus. In contrast, the capacitive tuning method illustrated in the first embodiment alters frequencies only plus or minus 1%. In most cases frequency tuning of one of the resonators in the manner shown in FIG. 12 will make it unnecessary to tune the frequency of the second resonator. It should be expressly noted that even if the dielectric rod 1202 comprises material with unpaired electrons, as may be the case with alumina, it may still be used in the present invention. Because only samples that are included in the volume where the two inductive loops intersect will produce a detectable EPR signal, stray or parasitic paramagnetic resonance will not interfere with performance of the resonant structure in accordance with the present invention.

7. Results

The resonator shown in FIGS. 1 and 2 was constructed for S-band and tested using an HP Network Analyzer to determine the degree of isolation between the primary resonator 101 and secondary resonator 102. The crossed-loop resonant structure 100 was tested on an S-band spectrometer with continuous wave and pulse excitation and the results compared with that of a reflection type resonator. Additional tests were run with a crossed-loop resonator in a superheterodyne type of spectrometer at continuous wave stimulation. When samples were changed the resonant frequencies were re-tuned and the angle between the resonant sections adjusted for maximum isolation. Isolation of 70 dB was consistently obtained. When isolation was reduced because of sample change, merely rotating the sample was sufficient to readjust to the original degree of isolation.

A primary feature of the present invention is that it reduces phase noise caused by the discrimination of the phase noise in the source. This is a process where the phase noise in the source is changed to amplitude noise by frequency characteristics of a reflection type resonator.

In continuous wave tests, the signal-to-noise ratio was about 1300 for the absorption signal which was equal to that obtained with standard reflection mode operation at 70 microwatt input power and 0.75 gauss of 100 kilohertz field modulation. However, the signalto-noise ratio for the dispersion signal for the crossed-loop resonator structure in accordance with the present invention was 925 about 22 dB better than the reflection mode resonator which was only 75 and was substantially as high as the signal-to-noise ratio for the absorption signal.

In order to test the resonator for rejection of phase noise a noise generator was connected to the FM input of the source. This phase noise generator increased the phase noise about 55 dB. The signal-to-noise for the reflection mode's absorption signal was reduced to 31 and the dispersion signal was impossible to obtain in the prior art reflection spectrometer. However, for crossed-loop resonant structure 100 the signal-to-noise for absorption was 1200 and dispersion signal-to-noise was 795 which were nearly the same as without the noise added. This demonstrates the outstanding ability of crossed-loop resonant structure 100 in accordance with the present invention to reject phase noise. The practical result of high phase noise rejection is that higher power and/or less expensive microwave bridges can be used to drive the resonator while achieving superior results.

In pulse mode, the crossed-loop resonant structure 100 in accordance with the present invention allowed measurement of electron spin echoes (ESE) starting at 70 nanoseconds after the last high power pulse. In the reflection mode, measurements could not be made before 220 nanoseconds after this pulse. It is important to be able to measure the ESE as soon as possible after the last high power pulse since this gives the best signal-to-noise ratio and provides important additional information about spin/nucleus interactions.

The degree of isolation between the two resonators of the crossed-loop resonator can be made at least 70 dB by careful machining, precision tuning, and the like. That is, the power coupled from resonator 101 into resonator 102 is less than one part in $10^7$. The above test results are the results obtainable from this amount of isolation. There is theoretically no limit to the degree of isolation obtainable and practically, even better results than these may be possible.

FIG. 13($a$) illustrates an absorption signal taken in a conventional prior art reflection spectrometer with no noise added. For this demonstration, the sample comprised NBS Coal No. 1635, input power was 70 microwatts, 100 kilohertz field modulation at 0.75 gauss was used. A single 60 second scan with a detector time constant of 0.128 seconds was employed. FIG. 13($a$) represents a conventional high quality signal generated by the prior art resonant type spectrometer under ideal conditions. FIG. 13($b$), however, represents the signal distortion that occurs with noise added as described above. Although the signal is still detectable from the output shown in FIG. 13($b$), noise causes distortion and difficulty in quantitatively measuring the response.

FIG. 13($c$) illustrates a dispersion signal measured in a conventional prior art reflection spectrometer with no noise added. As discussed in the background section, the dispersion signal measurements are inherently noise sensitive as phase noise in the source of microwave power is amplitude modulated by the resonator and appears as a noise signal superimposed on top of the desired signal as shown in FIG. 13($c$). In FIG. 13($d$), with noise added, it can be seen that the dispersion signal is virtually undetectable.

FIGS 14($a$)–14($d$) illustrate similar measurements taken with resonant structure 100 in accordance with the present invention. FIG. 14($a$) illustrates a standard absorption signal with no noise added that compares with FIG. 13($a$) in the prior art. Hence, under ideal conditions similar results are obtained with crossed-loop resonant structure 100 in accordance with the present invention. In contrast, FIG. 14(b) illustrates the absorption signal with noise added where it can be seen that the noise is substantially rejected by crossed-loop resonant structure 100 resulting in an output that is substantially similar to FIG. 14(a) where no noise was present. This is a substantial improvement over the prior art as seen by comparison of FIG. 14(b) with FIG. 13(b). Comparing FIG. 14(c) with FIG. 13(c), it can be seen that crossed-loop resonant structure 100 in accordance with the present invention is highly immune to inherent phase noise and provides a better dispersion signal even where no noise is added. In the case of the dispersion signal with added noise, FIG. 14(d) shows that crossed-loop resonant structure 100 provides a high quality signal where no signal was detectable in the reflection spectrometer in accordance with the prior art.

Figure 15:
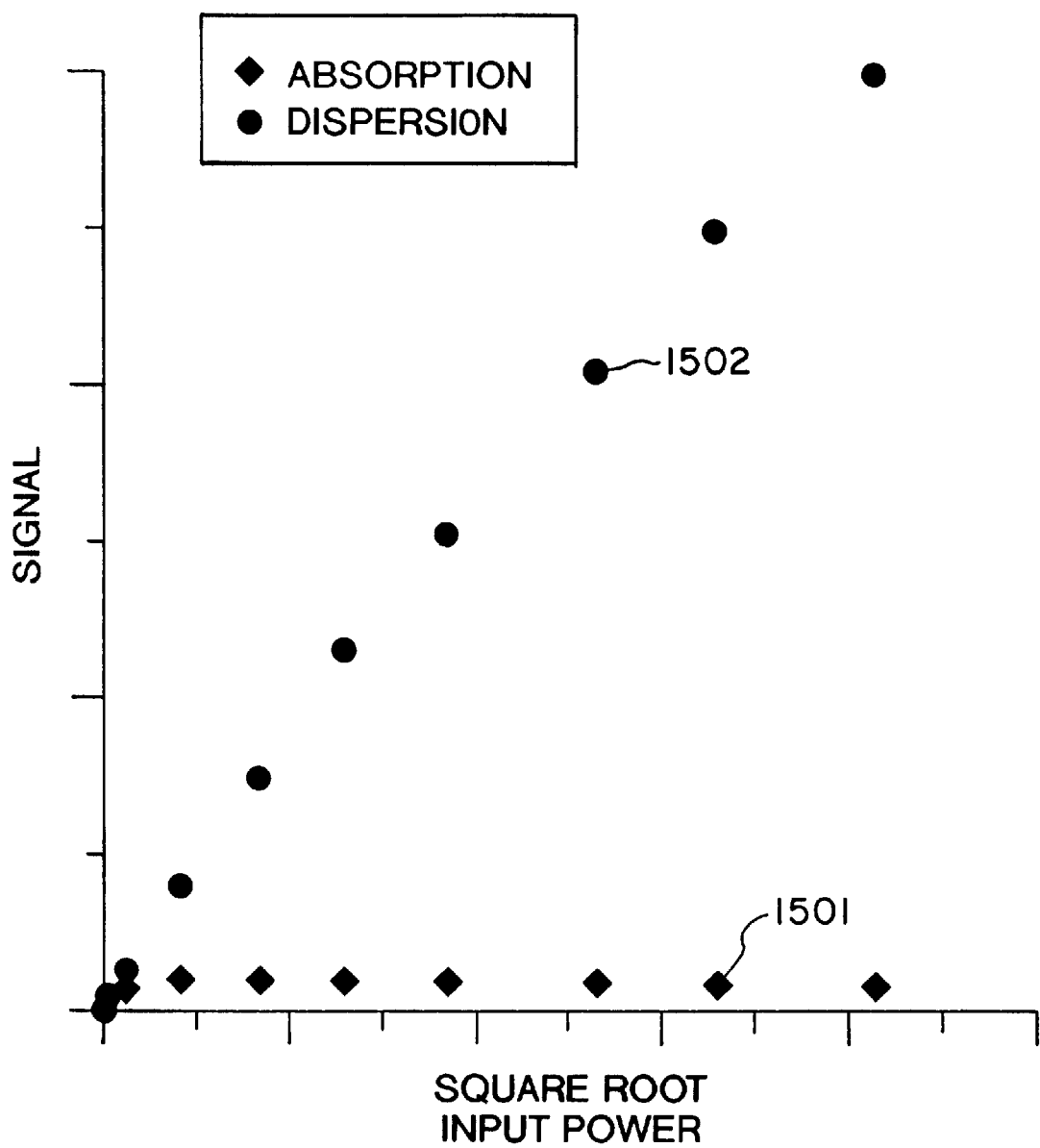
FIG. 15 shows a comparison of absorption and dispersion signals as input power is varied.

In addition to the improved results demonstrated in FIGS. 14(a)–14(d), the crossed-loop resonator in accordance with the present invention offers superior results when evaluating samples that saturate easily. FIG. 15 illustrates a comparison between a dispersion signal indicated by circular data points 1502 and an absorption signal indicated by diamond shaped data points 1501 for an irradiated fused quartz sample. In FIG. 15 the vertical axis represents signal amplitude while the horizontal axis is the square root of applied power. Samples such as irradiated fused quartz have absorption signals that saturate at low power as indicated by the flat line response as the input power is increased. The dispersion signal does not saturate as easily and can be measured at high power and the absorption signal calculated by Hilbert transform.

Until now, the phase noise sensitivity problem of prior reflection spectrometers limited the power at which these dispersion signals could be measured. Because the crossed-loop resonator structure in accordance with the present invention operates well in high power absorption or dispersion mode, significantly higher power signals can be taken from these easily saturated materials. For example, experimental measurements on irradiated fused quartz from which some the data of FIG. 15 was derived have been made at over one hundred times the power previously possible. In the experiments conducted, the input power level was limited only by the available power supply. Since the signal at this high power had not saturated, measurements at least ten times higher than that at which the experiments were conducted are believed practical with the apparatus in accordance with the present invention.

8. Superheterodyne Operation

Another difficulty in EPR measurements is related to "passage effects" or distortion of the EPR signal caused by field modulation used to extract the measured signal. If the field modulation could be eliminated, passage effects would no longer be a problem. The crossed-loop resonator structure in accordance with the present invention allows very stable operation in a superheterodyne mode that eliminated the need for field modulation.

Superheterodyne detection is a standard technique used in radio, television, and satellite communications. In accordance with this feature of the present invention, a lower intermediate frequency (IF) is created by mixing the high frequency EPR signal with another signal whose frequency differs by a constant amount. Where the IF is selected to be in a range that can be amplified and directly detected by a phase sensitive or equivalent detector, the field modulation signal can be eliminated. The advantage for a spectrometer is that the intermediate frequency can be well above 1/f noise (low frequency noise). When the IF signal is detected with a phase sensitive detector, the signal is proportional to the amplitude of the original high frequency (microwave) signal and the baseline is very stable as is the case with field modulation techniques.

FIG. 16 illustrates in block diagram form the superheterodyne configuration that was tested in accordance with the present invention. Microwave source 1601 is a microwave oscillator or other high frequency energy source that is coupled via a transmission line such as input coax 104 shown in FIG. 1 and FIG. 2 to crossed-loop resonant structure 100. Crossed-loop resonant structure 100 generates a high frequency signal that is output via a conductor such as coax 106 shown in FIG. 1 and FIG. 2. Mixer 1602 receives the high frequency output from crossed-loop resonant structure 100 as well as a local oscillator (LO) signal provided in these test by bi-phase modulator 1603. Double balanced mixer 1602 produces an intermediate frequency output as is well known. The intermediate frequency output is coupled to phase sensitive detector 1604 that has a detection band that includes and is preferably centered at the intermediate frequency. Phase sensitive detector 1604 then generates the ESE signal used for measurements. The use of the bi-phase modulator in these tests was a matter of convenience only and other more optimal superheterodyne configurations are well known and are equivalent to the specific example described.

Superheterodyne operation of the spectrometer is otherwise identical to the conventional spectrometer. The signal to the double balanced mixer no longer contains the reflection of the source power which is the case with the prior art reflection type spectrometer. The high isolation of crossed-loop resonant structure 100 in accordance with the present invention acts as a filter so that essentially only the desired EPR signal reaches the detector. In both spectrometers, the signal-to-noise ratio can be improved with the use of low noise microwave amplifier before the double balanced mixer.

In superheterodyne operation, field modulation is eliminated and a bi-phase or other suitable modulator 1603 is used to produce the local oscillator signal coupled to double balanced mixer 1602. The low frequency source 1605 of the modulation is the signal used for a reference to phase sensitive detector 1604. The intermediate frequency signal out of double balanced mixer 1602 then has a component of frequency which is the same as the frequency reference applied to phase sensitive detector 1604. In a particular example, the low frequency used was the source used in the conventional spectrometer for field modulation (100 kilohertz) since this would provide a proper signal frequency within the detection band of phase sensitive detector 1604. In addition, filtering to limit leakage of low frequency source 1605 into the IF input of Detector 1604 would have been beneficial. The superheterodyne configuration and choice of 100 kilohertz IF may not be optimum, but was used as a matter of convenience because the supply was available to demonstrate the performance of the crossed-loop resonator and provided outstanding results despite the non-optimum configuration. With field modulation, the modulation frequency must be kept low to prevent distortion of the EPR signal. With the superheterodyne configuration, there is no such limitation and the modulation frequency may be chosen to optimize signal-to-noise.

Superheterodyne detection in accordance with the present invention was used to measure saturation characteristics of a standard irradiated fused quartz sample and NBS number 1635 coal sample. The resulting spectra for irradiated fused quartz at 70 microwatts and 7 milliwatts source power are shown in FIG. 17(a) and FIG. 17(b) respectively. The spectra as measured are the true spectra and not the first derivative of the spectra as was used in FIG. 14. This is because there is no field modulation and the signals as generated by resonant structure 100 in accordance with the present invention are the direct amplitude of the spin system signals.

Detection of the amplitude or dispersion signal depends on the phase of the LO signal to the double balanced mixer 1602. The LO reference signal is derived from the microwave source by use of a suitable power divider and phase shifter as is well known. Spectra were recorded for 700 nanowatts to 700 milliwatts (four orders of magnitude) for both absorption and dispersion. The spectra did not change shape with power except for a slight broadening which is characteristic of saturation. This is more apparent in the dispersion spectra (not shown) than in absorption. The absorption signal shown in FIG. 17(a) and FIG. 17(b) was a maximum at 70 microwatts source signal. It was possible to obtain a true dispersion signal which was thirty times as high as this maximum absorption signal. Until now, it has been difficult to measure absorption and dispersion spectra for irradiated fused quartz at microwave field intensities corresponding to these power levels.

Tests have shown that resonant structure 100 in a superheterodyne mode in accordance with the present invention is capable of up to two orders of magnitude higher sensitivity than is possible with a prior art reflection type spectrometer. The noise did not increase with power but the signal did which means that higher power produced very high signal-to-noise. One significant aspect of this feature of the present invention is that the absorption signal for many biological samples saturate at very low power at cryogenic temperatures, but the dispersion signal does not. Orders of magnitude improvement and sensitivity for these types of samples are possible with a crossed-loop resonant structure in a superheterodyne mode in accordance with the present invention by measuring the dispersion signal at high power.

In a spin echo or FT EPR spectrometry the source power is off during observation. However, it is important to record the echo or free induction decay (FID) as early in time as possible following the source power pulse. In practice, the signal of interest overlaps the transient response of the resonator to the pulse. The pulse stores energy in the resonator that decays exponentially after the pulse is over. This "ring down" of the resonator produces a large transient signal which goes through the circulator to the detector the same as the desired ESE signal in the prior art system. Therefore, one must wait until the transient becomes small relative to the ESE signal before meaningful data can be observed. This creates a spectrometer "dead-time", a period of many time constants of the resonator ring-down during which an important part of the ESE signal is lost.

The crossed-loop resonant structure in accordance with the present invention has two sections and it is the ring-down of the secondary resonator 102 that is important in ESE since little of the energy of the first resonator reaches the detector. Since the second section is isolated from the first, very little energy from the pulse gets stored in the second resonator 102. As a result, the amplitude of the ring down is much smaller in a crossed-loop resonator (i.e., 1/3000 of that for the reflection resonator) and becomes small enough for ESE signal detection in a few time constants.

FIG. 18(a) is a time swept ESE spectra at S-band for NBS coal sample 1635 using a prior art reflection type resonator. FIG. 18(b) is a comparative spectra using a crossed-loop resonant structure 100 in accordance with the present invention. In pulse ESE measurements for NBS Coal using prior art resonators, the instrument dead-time is 220 nanoseconds. The detector of the spectrometer must be blocked for 220 nanoseconds after the pulse because the ring down transient before this time would saturate the detector. Using crossed-loop resonant structure 100 in accordance with the present invention, the detector could be opened after 70 nanoseconds, 150 nanoseconds earlier than for the reflection mode resonator. As can be seen, the reflection mode resonator was not able to detect the earlier peak at 170 nanoseconds that was clearly visible in the ESE signal for the crossed-loop resonant structure in accordance with the present invention. It is important to be able to measure the ESE signal as soon as possible after the last high energy pulse since this gives the best signal-to-noise and provides important additional information about spin/nucleus interactions.

9. Rotation About Multiple Axes

Figure 19:
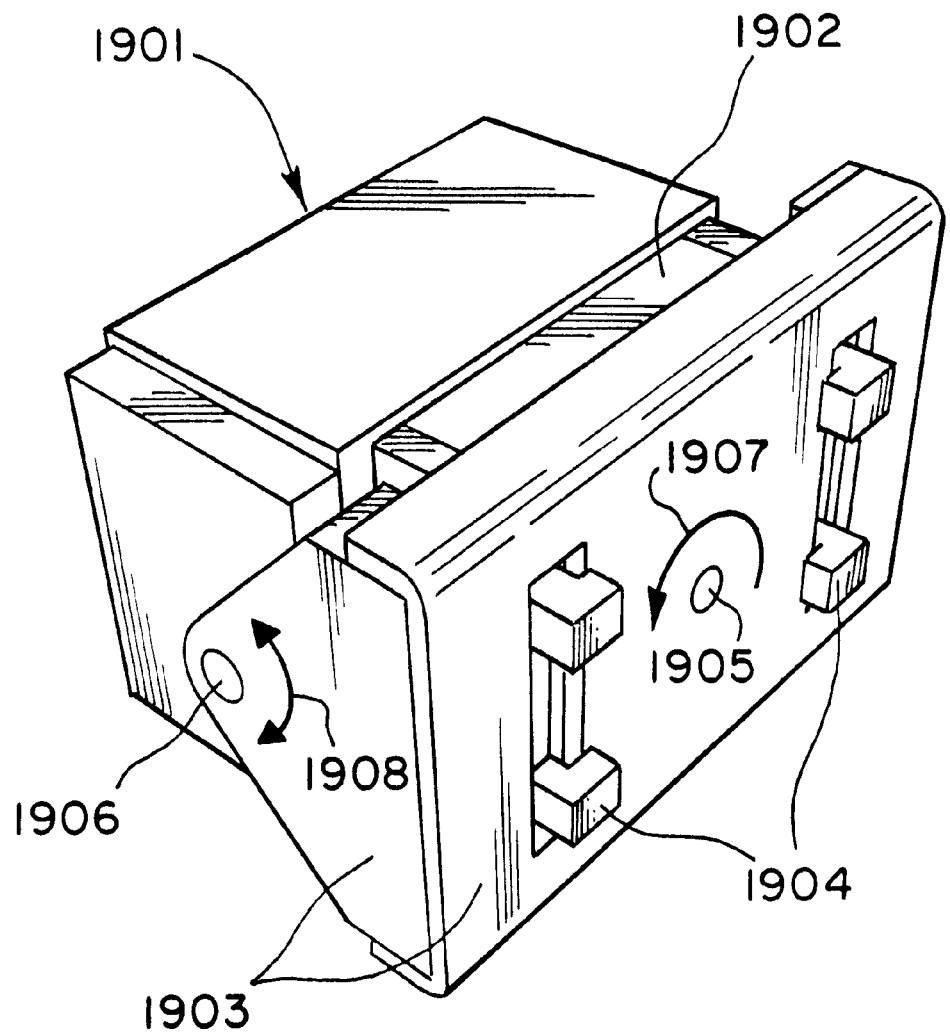
FIG. 19 is a perspective view of an alternative embodiment of the present invention that enable rotation of two resonators about two orthogonal axes.

FIG. 19 is a perspective view of an alternative embodiment of the cross-loop resonator structure described above. This embodiment allows rotation of the two resonators about two orthogonal axes 1907 and 1908 for the purpose of increasing the electrical isolation between the two resonators. FIG. 19 shows one means for providing the additional rotational degree of freedom. The two resonators 1901 and 1902 are constructed similar to those described above. The second resonator 1902 is attached to a bracket 1903 by means of cleats 1904 and a pin 1905. The cleats 1904 and pin 1905 hold the second resonator 1902 in a secure manner, while allowing rotation about a first axis 1907 (i.e., the same axis as in the embodiment described above). The bracket 1903 replaces portions of the field orthogonality tuning mechanism 103 depicted in FIG. 1, but the knob 601, lead screw 602, and nut 603 would also serve to rotate the second resonator 1902 in the embodiment of FIG. 19.

The bracket 1903 is attached to the first resonator 1901 by means of two pins 1906 (only one pin 1906 is visible in FIG. 19) along a second axis 1908. These pins 1906 allow the second resonator 1902 and bracket 1903 to be rotated as a unit about the second axis 1908 in a manner similar to that used to rotate the second resonator 1902 about the first axis 1907. Similar to the one-axis embodiment illustrated in FIG. 1, a second knob, lead screw, and nut can be used to adjustably control rotation of the second resonator 1902 and bracket 1903 about the second axis 1908.

The one-axis adjustment described in the first embodiment allows the magnetic fields of the two resonators to be adjusted so that they are orthogonal. However, slight machining errors could cause the electrical and magnetic fields to not be exactly orthogonal. This can result in a phase difference in the coupling between the two resonators that cannot be completely eliminated by rotation in only one axis. Rotation about two axes provides a means for individually adjusting the orthogonality of the magnetic and electric fields, thus reducing the phase difference in the coupling and providing much greater isolation between the two resonators. Tests have shown that an increase of at least 10 to 20 dB is possible with the two-axis embodiment shown in FIG. 19. The provisions for inserting the sample and electrical tuning of the resonators in the two-axis embodiment are the same as previously discussed regarding the first one-axis embodiment.

10. Conclusion

The present invention provides numerous advantages over prior reflection resonators for EPR Spectroscopy. As little as $1\times10^{-7}$ of the microwave source power reaches the detector, providing 70 dB of isolation. As a result, source noise is substantially eliminated in the detected signal and time domain EPP can be performed without a limiter or switch to protect the microwave amplifier. The elimination of the microwave circulator, which is magnetic and cannot be placed in the magnetic field, permits crucial microwave elements (e.g., a microwave amplifier) to be placed physically near the sample and, in cooled measurements, cooled along with the sample, resulting in improved signal-to-noise ratio.

For broad EPR spectra, low signal-to-noise in prior spectrometers is limited by the small magnetic field modulation relative to the spectral line width. The large modulation amplitudes achievable introduced noise because of the electro-mechanical interaction of the modulation field with the resonator. For samples with long relaxation times, distortion of spectra by magnetic field modulation due to passage effects interfered with spectral interpretation. Samples with long relaxation times are better studied using dispersion spectra instead of the more common absorption spectra, since the dispersion signal does not saturate easily. However, in prior reflection resonators the dispersion spectra have lower signal-to-noise ratio that the absorption spectra due to the demodulation of the microwave phase noise. All of these problems are substantially simplified or eliminated by the present invention due to the high source-noise immunity and optional elimination of the magnetic field modulation.

Although the present invention has been described in terms of a single frequency measurement and pulse EPR, the present invention is also applicable to multiple frequency EPR. There is increasing interest in EPR at multiple frequencies. One problem with prior reflection resonators is that the ring-down of the resonator increases in direct proportion to the wavelength. Hence, ring-down is intolerable at low frequencies. Fourier transform (FT) EPR becomes poorly defined at low frequency due to the long dead-time relative to the FID decay time. Commercially available microwave sources are noisier at lower frequencies. The resonant structure in accordance with the present invention overcomes these deficiencies by allowing multiple frequency measurement through independent tuning of the resonant structures. Isolation of source substantially eliminates the ring-down problem thereby enabling lower frequency measurements. Further, isolation of microwave source noise allows operation of the source at lower frequency.

There is also increasing interest in the nature of electron spins native to biologically important species. Further, interests exist in the study of probes having distinct electron spins that are added to biologically important species. Until now, such interests have been impeded by the above identified limitations of reflection EPR spectrometers. The present invention enables EPR research into native and added electron spins in biological samples.

EPR imaging of biological samples is also enabled using the teachings of the present invention. In accordance with the present invention EPR can be extended to lower frequencies and higher powers than previously possible. The low frequency allows deeper penetration of samples. Higher power provides higher signal-to-noise ratio. Hence, it is contemplated that laboratory and clinical instruments similar to magnetic resonance imaging (MRI) are possible using the teachings of the present invention. It is believed that EPR images will allow imaging of the biological results of specific pathogens or of induced spin labels in contrast to the proton densities imaged by MRI.

In accordance with the present invention, EPR spectroscopy is more reproducible, easier and less expensive to obtain, and requires less user training. Precise coupling to the crossed-loop resonant structure is not required as it is with reflection resonators; this is true for both the driven (i.e., primary) resonator and the detected (i.e., secondary) resonator. Remote tuning such as is useful in cryostats and other hostile environments is greatly simplified. Moreover, electronic tuning using varactors is also contemplated.

The crossed-loop resonator in accordance with the present invention is more tolerant of temperature changes than prior reflection type resonators. This increased tolerance results in measurement accuracy and repeatability in environments that change temperature as well as stability as temperature changes due to ohmic losses of the microwave power during operation.

The increased sensitivity of the present invention resonator enables measurements of samples with fewer spins and provides spectra that are less distorted and can be actual spectra in contrast with derivative of the spectra. These improvements allow easier data interpretation with fewer opportunities for error.

ELDOR, described above, is facilitated by the present invention resonant structure. Separation between the pumped and observation frequencies is not limited by the bandwidth of a single resonator mode as was the case in prior reflection type spectrometers. The pump mode can be low-Q or overcoupled to achieve wide bandwidth, and the observe mode can be high-Q at the desired observe frequency. There is little practical limitation on the frequencies used. The present invention is applicable to either steady-state or pulsed ELDOR. Although ELDOR has long been a technique with promise, the present invention allows practical application that allows the relaxation times accessible via ELDOR to be studied.

By now it should be appreciated that a crossed-loop resonant structure is provided that substantially eliminates source phase noise as a problem in the EPR spectroscopy. This allows operation at much higher powers and the use of less expensive sources. A high degree of isolation between two loops in the crossed-loop resonant structure of the present invention and the elimination of reflected power from the first loop reaching the detector allow operation in superheterodyne detection with a very stable baseline. This eliminates the need for field modulation and the signal distortion associated with field modulation. The crossed-loop resonator in accordance with the present invention provides a simple means of maintaining high isolation with the introduction of the sample. The sample disturbs the microwave field and causes leakage of source power into the signal. In all cases the isolation could be maintained at 70 dB with or without the sample using the crossed-loop resonant structure in accordance with the present invention.

The elimination of phase noise and passage effects allows true dispersion spectra to be obtained at power levels much higher than the saturation power level of the absorption signal. This can increase spectrometer sensitivity more than two orders of magnitude. A high degree of isolation in the crossed-loop resonant structure reduces the effect of resonator ring down and significantly decreases the dead-time of the instrument in pulse type measurements. The present invention allows observation of ESE signals for example starting at 70 nanoseconds as compared to 220 nanoseconds with the reflection mode resonator of the prior art at S-band.

While the preferred embodiments and specific implementations disclosed herein are believed to be the best modes of operation, it will be readily apparent that equivalent structures and substitute materials and design modifications are possible. The specific dimensions, material compositions, and shapes of features of the preferred embodiments are not intended as limitations, but instead are illustrations of the broader concepts incorporated in the present invention.

I claim:

1. A resonator structure comprising:

a first resonator comprising a first resonator loop formed by a hollow channel with conductive walls to confine a first high frequency magnetic field;

a second resonator comprising a second resonator loop formed by a hollow channel with conductive walls to confine a second high frequency magnetic field, wherein flux lines of said first magnetic field are substantially orthogonal to flux lines of said second magnetic field, and wherein the first resonator loop and the second resonator loop intersect so that the first and second resonator loops are substantially shielded to prevent coupling of said first and second magnetic fields from the first and second resonator loops; and means for adjusting the orthogonality of the magnetic fields within said first and second resonator loops by adjustably rotating said second resonator with respect to said first resonator about either of two orthogonal axes passing through the intersection of said first and second resonators.

2. The resonator structure of claim 1 wherein the first resonator loop is adapted to confine a time varying magnetic field and the second resonator loop intersects the first resonator loop at an angle selected to substantially decouple the time varying magnetic field in the first resonator loop from the second resonator loop.

3. The resonator structure of claim 1 wherein the first and second resonator loops intersect substantially orthogonally.

4. The resonator structure of claim 1 further comprising:

means for supplying a time varying stimulus signal into the first resonator loop;

means for placing a sample into the intersection of the first resonator loop and the second resonator loop; and means for detecting a time varying response signal in the second resonator loop.

5. A crossed-loop resonator structure comprising:

a first lumped element type resonator comprising a first block of material having a first planar gap formed in a central portion to provide a first capacitor and a first annular loop surrounding the gap, wherein the first planar gap and the first annular loop have conductive walls and are electrically connected, wherein the first planar gap and the first annular loop are substantially oriented in a first plane;

a hole having conductive sidewalls extending through the first block of material perpendicularly intersecting the first annular loop;

a planar opening having conductive sidewalls formed in the first block and oriented substantially perpendicularly to the first planar gap, the planar opening extending from a sidewall of the hole away from the first planar gap to an edge of the first block;

a second block of material having a second planar gap formed in an interior portion and a second annular loop partially surrounding the second planar gap, wherein the second planar gap and the second annular loop have conductive sidewalls and are electrically connected, wherein edges of the second block of material define a cutout portion intersecting the second annular loop and second planar gap and the cutout portion is shaped to receive the first block of material so that the bore and second annular loop align to form a closed loop surrounding the second planar gap and the second planar gap is aligned with the planar opening of the first block of material to form a second capacitor; and means for rotatably connecting said first block of material and said second block of material so that said first block can be rotated with respect to said second block about at least two perpendicular axes passing through an intersection of said first annular loop and said second annular loop.

6. The crossed-loop resonator of claim 5 wherein the first block of material is electrically shorted to the second block of material at substantially all abutting surfaces.

7. The crossed-loop resonator of claim 6 further comprising conductive joining means positioned at abutting surfaces of the first and second blocks for conductively coupling the first and second blocks while allowing at least two degree of rotational freedom between the first and second rotating blocks.

8. The crossed-loop resonator of claim 5 wherein said first and second materials comprise metal.

9. A resonator structure comprising:

primary and secondary lumped element resonators each comprising a hollow conductive envelope having a thin interior portion forming a gap and a thicker annular portion forming a loop and the conductive envelope forming a shield enclosing the loop and gap;

a discontinuity formed in the loop portion of each of the primary and secondary resonators, the discontinuity allowing the loop of the primary resonator to intersect the loop of the secondary resonator;

means for supplying high frequency energy to the primary resonator;

means for supplying a sample to the intersection of the primary resonator loop and the secondary resonator loop;

means for detecting high frequency energy in the secondary resonator; and means for adjusting the orthogonality of a magnetic field in the loop of at least one resonator with respect to the magnetic field in the other of the resonators by adjustably rotating the secondary resonator with respect to the primary resonator about two orthogonal axes passing through the intersection of the primary resonator and the secondary resonator.

10. The resonator structure of claim 9 wherein the means for supplying high frequency energy comprises a coaxial feed capacitively coupled to the gap of the primary resonator.

11. The resonator structure of claim 10 wherein the coaxial feed terminates on one side of the gap in the thin interior portion of the primary resonator and the primary resonator further comprises a conductive slug positioned opposite the coaxial feed termination wherein the conductive slug has an adjustable distance from the coaxial feed termination.

12. The resonator structure of claim 9 wherein the means for supplying high frequency energy further comprises a loop of wire placed within the loop of the at least one resonator.

13. The resonator structure of claim 9 further comprising tuning means within at least one of the resonators for adjusting the resonant frequency of at least one resonator.

14. The resonator structure of claim 13 wherein the tuning means further comprises a conductive slug coupled to one side of the gap in each of the primary and secondary resonators wherein the conductive slug extends a user selectable distance into the gap towards the opposing side of the gap to create a variable gap capacitance.

15. The resonator structure of claim 13 wherein the tuning means further comprises a dielectric slug positioned inside at least one of the primary and secondary resonators.

* * * * *